US012581864B2

(12) United States Patent
Chen et al.

(10) Patent No.: US 12,581,864 B2
(45) Date of Patent: Mar. 17, 2026

(54) MEMORY DEVICE AND FABRICATION METHOD THEREOF

(71) Applicant: Taiwan Semiconductor Manufacturing Co., Ltd., Hsinchu (TW)

(72) Inventors: Jun-Yao Chen, Hsinchu (TW); Sheng-Huang Huang, Hsinchu (TW); Hung-Cho Wang, Hsinchu (TW); Harry-Hak-Lay Chuang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 372 days.

(21) Appl. No.: 17/210,871

(22) Filed: Mar. 24, 2021

(65) Prior Publication Data

US 2022/0020920 A1     Jan. 20, 2022

Related U.S. Application Data

(60) Provisional application No. 63/052,704, filed on Jul. 16, 2020.

(51) Int. Cl.
| | |
|---|---|
| *H10N 50/01* | (2023.01) |
| *H10B 61/00* | (2023.01) |
| *H10N 50/10* | (2023.01) |
| *H10N 50/80* | (2023.01) |

(52) U.S. Cl.
CPC ............. *H10N 50/10* (2023.02); *H10B 61/00* (2023.02); *H10N 50/01* (2023.02); *H10N 50/80* (2023.02)

(58) Field of Classification Search
CPC ......... H10N 50/10; H10N 50/01; H10B 61/00
See application file for complete search history.

(56) References Cited

U.S. PATENT DOCUMENTS

| | | | |
|---|---|---|---|
| 9,905,282 B1 | 2/2018 | Yi et al. | |
| 10,163,651 B1 * | 12/2018 | Chen ................... | H10N 70/063 |
| 10,454,021 B2 | 10/2019 | Sung et al. | |
| 11,031,543 B2 | 6/2021 | Liao et al. | |
| 11,043,251 B2 | 6/2021 | Shen et al. | |
| 2011/0156181 A1 | 6/2011 | Takeuchi et al. | |
| 2013/0026585 A1 * | 1/2013 | Sung ..................... | H10N 50/01 |
| | | | 257/E29.323 |
| 2013/0267042 A1 | 10/2013 | Satoh et al. | |
| 2015/0311253 A1 | 10/2015 | Choi et al. | |
| 2017/0084820 A1 * | 3/2017 | Tan ........................ | H10N 50/01 |
| 2017/0222128 A1 | 8/2017 | Sung et al. | |
| 2017/0256611 A1 | 9/2017 | Kim et al. | |

(Continued)

FOREIGN PATENT DOCUMENTS

| | | |
|---|---|---|
| CN | 110112288 A | 8/2019 |
| DE | 10 2016 114 870 A1 | 8/2017 |

(Continued)

*Primary Examiner* — Eric K Ashbahian
(74) *Attorney, Agent, or Firm* — Seed IP Law Group LLP

(57) ABSTRACT

A memory device includes a bottom electrode, a magnetic tunnel junction (MTJ) stack, a top electrode, and a sidewall spacer. The MTJ stack is over the bottom electrode. The top electrode is over the MTJ stack. The sidewall spacer laterally surrounds the MTJ stack and the top electrode. The sidewall spacer has an outermost sidewall laterally set back from an outermost sidewall of the bottom electrode.

20 Claims, 29 Drawing Sheets

(56) References Cited

U.S. PATENT DOCUMENTS

| | | | |
|---|---|---|---|
| 2018/0040809 A1 | 2/2018 | Moon | |
| 2018/0097175 A1* | 4/2018 | Chuang | H10B 61/00 |
| 2019/0051734 A1 | 2/2019 | Lin et al. | |
| 2019/0088863 A1* | 3/2019 | Lu | H10N 70/826 |
| 2019/0165256 A1* | 5/2019 | Tien | G11C 11/161 |
| 2020/0044087 A1 | 2/2020 | Guha et al. | |
| 2020/0135805 A1 | 4/2020 | Hsu | |
| 2020/0403144 A1 | 12/2020 | Lai et al. | |
| 2021/0151502 A1* | 5/2021 | Kim | G11C 11/161 |
| 2021/0305316 A1* | 9/2021 | Wu | H10N 50/80 |
| 2021/0389394 A1* | 12/2021 | Wang | G11C 11/02 |

FOREIGN PATENT DOCUMENTS

| | | |
|---|---|---|
| DE | 10 2019 113 416 A1 | 4/2020 |
| DE | 10 2019 113 486 A1 | 4/2020 |
| DE | 10 2019 126 464 A1 | 6/2020 |
| TW | I567964 B | 1/2017 |

\* cited by examiner

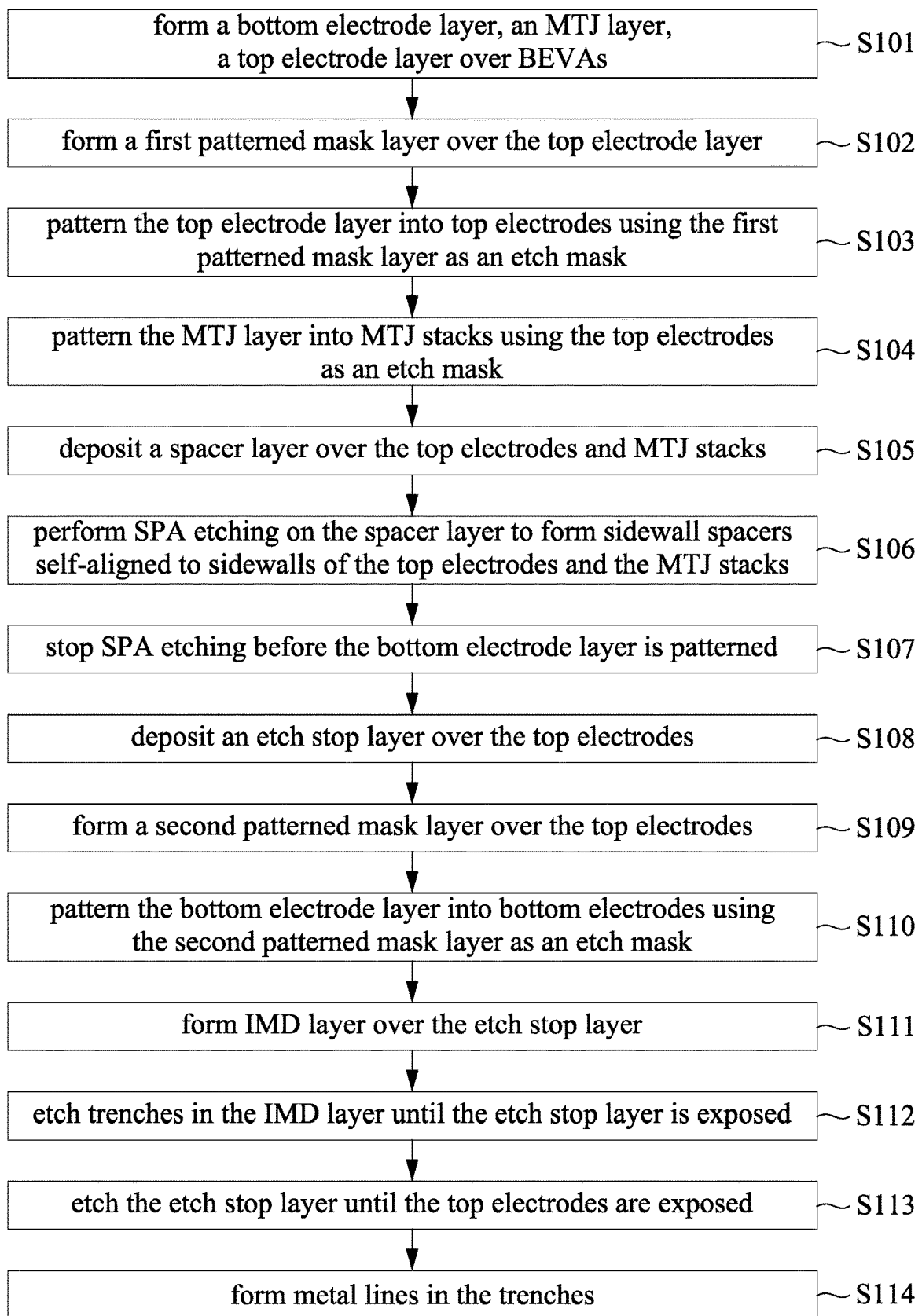

| | |
|---|---|
| form a bottom electrode layer, an MTJ layer, a top electrode layer over BEVAs | S101 |
| form a first patterned mask layer over the top electrode layer | S102 |
| pattern the top electrode layer into top electrodes using the first patterned mask layer as an etch mask | S103 |
| pattern the MTJ layer into MTJ stacks using the top electrodes as an etch mask | S104 |
| deposit a spacer layer over the top electrodes and MTJ stacks | S105 |
| perform SPA etching on the spacer layer to form sidewall spacers self-aligned to sidewalls of the top electrodes and the MTJ stacks | S106 |
| stop SPA etching before the bottom electrode layer is patterned | S107 |
| deposit an etch stop layer over the top electrodes | S108 |
| form a second patterned mask layer over the top electrodes | S109 |
| pattern the bottom electrode layer into bottom electrodes using the second patterned mask layer as an etch mask | S110 |
| form IMD layer over the etch stop layer | S111 |
| etch trenches in the IMD layer until the etch stop layer is exposed | S112 |
| etch the etch stop layer until the top electrodes are exposed | S113 |
| form metal lines in the trenches | S114 |

Fig. 20

MEMORY DEVICE AND FABRICATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 is a flow chart illustrating a method of forming an integrated circuit structure in accordance with some embodiments of the present disclosure.

DETAILED DESCRIPTION

Figure 1:
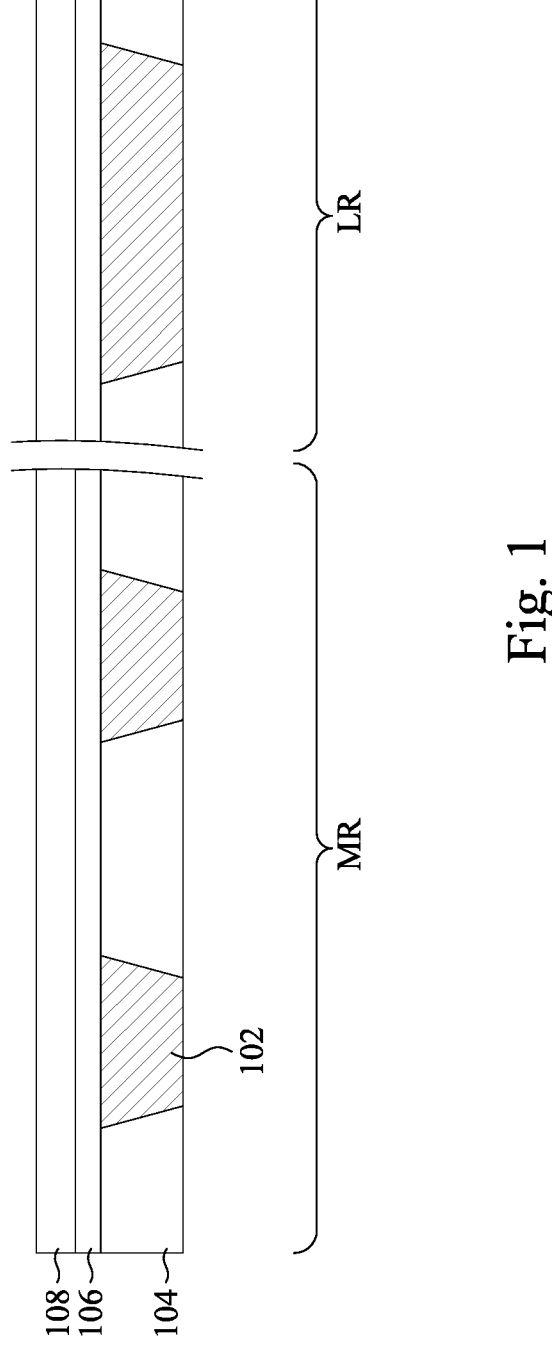
FIGS. 1-15B illustrate cross-sectional views and top views of intermediate stages in formation of an integrated circuit structure having an embedded memory region and a logic region, in accordance with some embodiments of the present disclosure.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Embodiments of the present disclosure relate to magnetoresistive random access memory (MRAM) cells and related fabrication methods. The MRAM cell in an integrated circuit includes a magnetic tunnel junction (MTJ) stack vertically arranged within a back-end-of-the-line (BEOL) interconnect structure between a bottom electrode and a top electrode. The MTJ stack includes a ferromagnetic pinned layer and a ferromagnetic free layer, which are vertically separated by a tunnel barrier layer. The tunnel barrier layer is thin enough (such a few nanometers) to permit electrons to tunnel from one ferromagnetic layer to the other. The magnetic orientation of the ferromagnetic pinned layer is static (i.e., fixed), while a magnetic orientation of the ferromagnetic free layer is capable of switching between a parallel configuration and an anti-parallel configuration with respect to that of the ferromagnetic pinned layer. Therefore, a resistance of the MTJ stack can be adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a first data state (e.g., a logical "0"). When the magnetic moment of the ferromagnetic free layer is anti-parallel to that of the ferromagnetic pinned layer, the resistance of the MTJ stack is in a higher resistive state, corresponding to a second digital data state (e.g., digital signal "1"). The MTJ stack is coupled between top and bottom electrodes, and an electric current flowing through the MTJ stack (tunneling through the tunnel barrier layer) from one electrode to the other is detected to determine the resistance and the state of digital data of the MTJ stack.

In MRAM cell fabrication, a bottom electrode layer, a MTJ layer and a top electrode layer are deposited blanket over a wafer, the top electrode layer and the MTJ layer are then patterned into top electrodes and MTJ stacks under the respective top electrodes, a spacer layer is then deposited over the top electrodes and the MTJ stacks, followed by a self-aligned spacer (SPA) etching process to etch the spacer layer to form spacers around the respective MTJ stacks. The SPA etching also breaks the bottom electrode layer into bottom electrodes below the respective MTJ stacks. It has been appreciated that the top electrodes may also be etched and thus consumed by the SPA etching, which in turn would lower heights of the top electrodes, thus leading to a tightened landing window for metal lines landing on top electrodes. For example, if the heights of the top electrodes are reduced, then the MTJ stacks may be more susceptible to damages caused by the trench etching operation for forming metal lines.

The present disclosure, in some embodiments, relates to a method of forming MRAM cells with a relaxed landing window for forming metal lines on top electrodes. For example, the SPA etching can stop before the bottom electrode layer is patterned, which prevents the top electrodes from being etched and consumed by the SPA etching. Moreover, an additional etch stop layer is formed over the top electrodes after the SPA etching. The etch stop layer may serve to protect the top electrodes from the trench etching operation for forming metal lines, which in turn alleviates or prevents height reduction in the top electrodes. Moreover, an additional photolithography process is carried out to form a photoresist mask covering the top electrodes before patterning the bottom electrode layer. The photoresist mask also provides protection for the top electrodes against the etching process of patterning the bottom electrode layer, which in turn alleviates or prevents height reduction in the top electrodes. Because height reduction in top electrodes caused by one or more etching process of fabricating MRAM cells can be alleviated or prevented, which in turn allows for a relaxed landing window for forming metal lines on the top electrodes.

FIGS. 1-15B illustrate cross-sectional views and top views of intermediate stages in formation of an integrated circuit structure 100 having an embedded memory region MR and a logic region LR, in accordance with some embodiments of the present disclosure. Although the cross-sectional views and top views shown in FIGS. 1-15B are described with reference to a method, it will be appreciated that the structures shown in FIGS. 1-15B are not limited to the method but rather may stand alone separate of the method. Although FIGS. 1-15B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. FIGS. 1, 2, 3A, 4A, 5A, 6, 7A, 8, 9A, 10A, 11, 12A, 13A, 14, and 15A are cross-sectional views of intermediate stages in formation of the integrated circuit structure 100 according to some embodiments of the present disclosure. FIGS. 3B, 4B, 5B, 7B, 9B, 10B, 12B, 13B, and 15B are top views of intermediate stages in formation of the integrated circuit structure 100 according to some embodiments of the present disclosure.

As shown in the cross-sectional view of FIG. 1, an initial structure of the integrated circuit structure 100 includes metal lines 102 extending laterally or horizontally within an inter-metal dielectric (IMD) layer 104 that spans the embedded memory region MR and the logic region LR. The integrated circuit structure 100 further includes an etch stop layer 106 over the metal lines 102 and the IMD layer 104, and a dielectric layer 108 over the etch stop layer 106. The etch stop layer 106 and the dielectric layer 108 both span the embedded memory region MR and the logic region LR.

The IMD layer 104 is made of one or more low-k dielectric materials having k value (i.e., dielectric constant), for example, lower than about 4.0 or even 2.0 disposed between such conductive features. In some embodiments, the IMD layers 104 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like. In some embodiments, the IMD layer 104 is made of an extreme low-k (ELK) dielectric material with a dielectric constant less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). The IMD layer 104 can be formed on wafer by any suitable methods, such as spin-on coating, chemical vapor deposition (CVD), plasma-enhanced CVD (PECVD), or the like.

Formation of the metal lines 102 includes forming trenches in the IMD layer 104 using suitable photolithography and etching techniques, depositing one or more metal layers into the trenches in the IMD layer 104, and removing excess materials of the one or more metal layers outside the trenches in the IMD layer 104. The remaining materials of the one or more metal layers in the IMD layer 104 serve as the metal lines 102. The metal lines 102 include suitable metals such as copper, aluminum, tungsten, combinations thereof, or the like, and may be formed using physical vapor deposition (PVD), chemical vapor deposition (CVD), atomic layer deposition (ALD), other suitable deposition techniques, or combinations thereof. In some embodiments, the metal lines 102 may further comprise one or more barrier/adhesion layers (not shown) to protect the IMD layer 104 from metal diffusion (e.g., copper diffusion) and metallic poisoning. The one or more barrier/adhesion layers may comprise titanium, titanium nitride (TiN), tantalum, tantalum nitride (TaN), or the like, and may be formed using PVD, CVD, ALD, combinations thereof, or the like.

After the metal lines 102 are formed in the IMD layer 104, an etch stop layer 106 is formed over the metal lines 102 and the IMD layer 104 by using suitable deposition techniques, such as PVD, CVD, ALD, the like, or combinations thereof. The etch stop layer 106 spans the embedded memory region MR and the logic region LR. The etch stop layer 106 is made of a different material than the overlying dielectric layer 108. Therefore, the etch stop layer 106 and the dielectric layer 108 have different etch selective properties, which allows for etching the dielectric layer 108 at a faster etch rate than etching the etch stop layer 106 in a subsequent etching process. The etch stop layer 106 can thus slow down or even stop the etching process of etching the dielectric layer 108, so that determination of etching end point is made clearer by the etch stop layer 106. In some embodiments, the etch stop layer 106 is made of nitrogen-doped carbide (NDC), but other suitable materials, such as oxygen-doped carbide (ODC), hydrogen and nitrogen doped carbide (HNDC), silicon carbide (SiC), can also be used.

After the etch stop layer 106 is deposited over the metal lines 102 and the IMD layer 104, a dielectric layer 108 is formed over the etch stop layer 106. In some embodiments, the dielectric layer 108 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the etch stop layer 106. The dielectric layer 108 may be deposited by CVD, PVD, ALD or other suitable deposition techniques.

Figure 2:
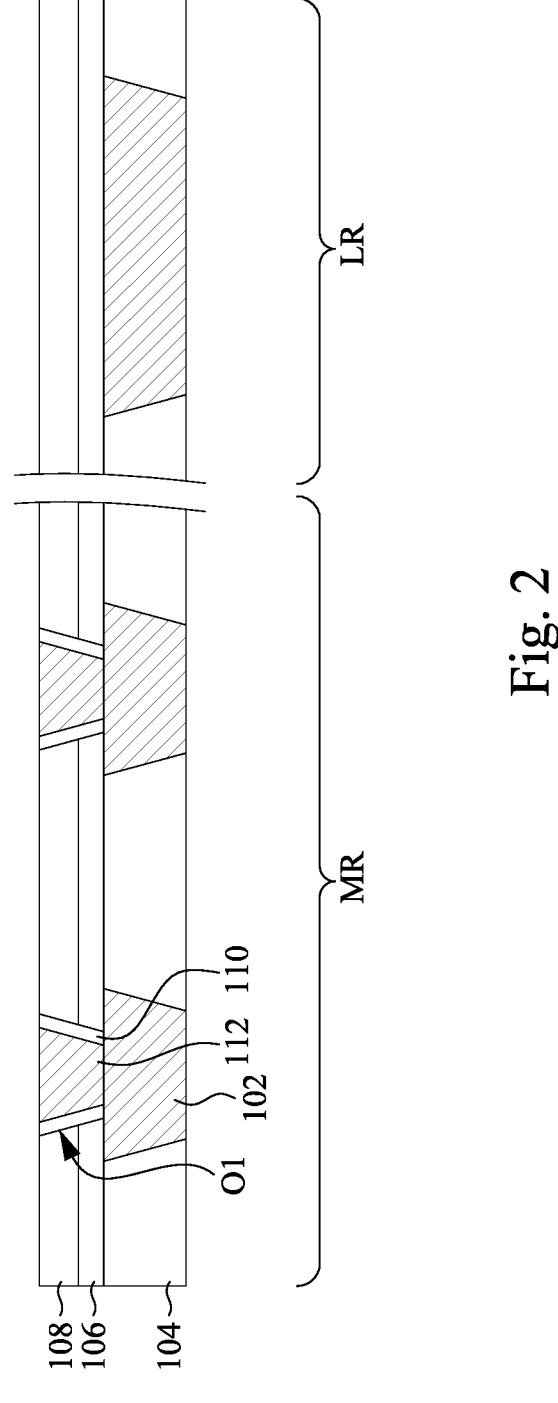

As shown in cross-sectional view of FIG. 2, a barrier layer 110 and a bottom electrode via (BEVA) 112 are formed extending through the dielectric layer 108 and the etch stop layer 106. In some embodiments, formation of the barrier layer 110 and the BEVA 112 includes patterning the dielectric layer 108 and the etch stop layer 106 to form via openings O1 within the embedded memory region MR, extending through the dielectric layer 108 and the etch stop layer 106 to expose the respective metal lines 102, conformally depositing a barrier material lining sidewalls and bottom surfaces of the via openings O1, depositing a BEVA material overfilling the via openings O1, followed by performing a chemical mechanical polish (CMP) process to remove excess BEVA material and excess barrier material outside the via openings O1, while leaving the barrier material in the via openings O1 to serve as the barrier layers 110 lining the respective via openings O1, and leaving the BEVA material in the via openings O1 to serve as the BEVAs 112 laterally surrounded by the barrier layers 110. In some embodiments, before depositing the BEVA material, an anisotropic etching process is optionally performed to remove lateral portions (or horizontal portions) of the barrier material, while leaving inclined portions (or vertical portions if the via openings O1 have vertical sidewalls) in the via openings O1. In that case, the BEVA material is deposited directly on the metal lines 102, and thus the BEVAs 112 are respectively in contact with the metal lines 102.

In some embodiments, the BEVAs 112 are made of platinum (Pt), ruthenium (Ru), tungsten (W), aluminum (Al), copper (Cu), the like, or combinations thereof. In some embodiments, the barrier layer 110 includes tantalum (Ta), titanium (Ti), tantalum nitride (TaN), or titanium nitride (TiN) that prevents the BEVA material from diffusing into the surrounding dielectric layer 108 and etch stop layer 106. The barrier material and BEVA material can be deposited using CVD, PVD, ALD, the like, or combinations thereof. In some embodiments, the via openings O1 are etched by using an etchant that etches the dielectric layer 108 at a faster etch rate than it etches the etch stop layer 106. In this way, the etching process for forming the via openings O1 can be slowed down by the etch stop layer 106, which in turn prevents the metal lines 102 from being damaged by this etching process. For example, the etchant includes hydrofluoric acid or the like, if the dielectric layer 108 is made of silicon oxide and the etch stop layer 106 is made of nitrogen-doped carbide.

Figure 3A:
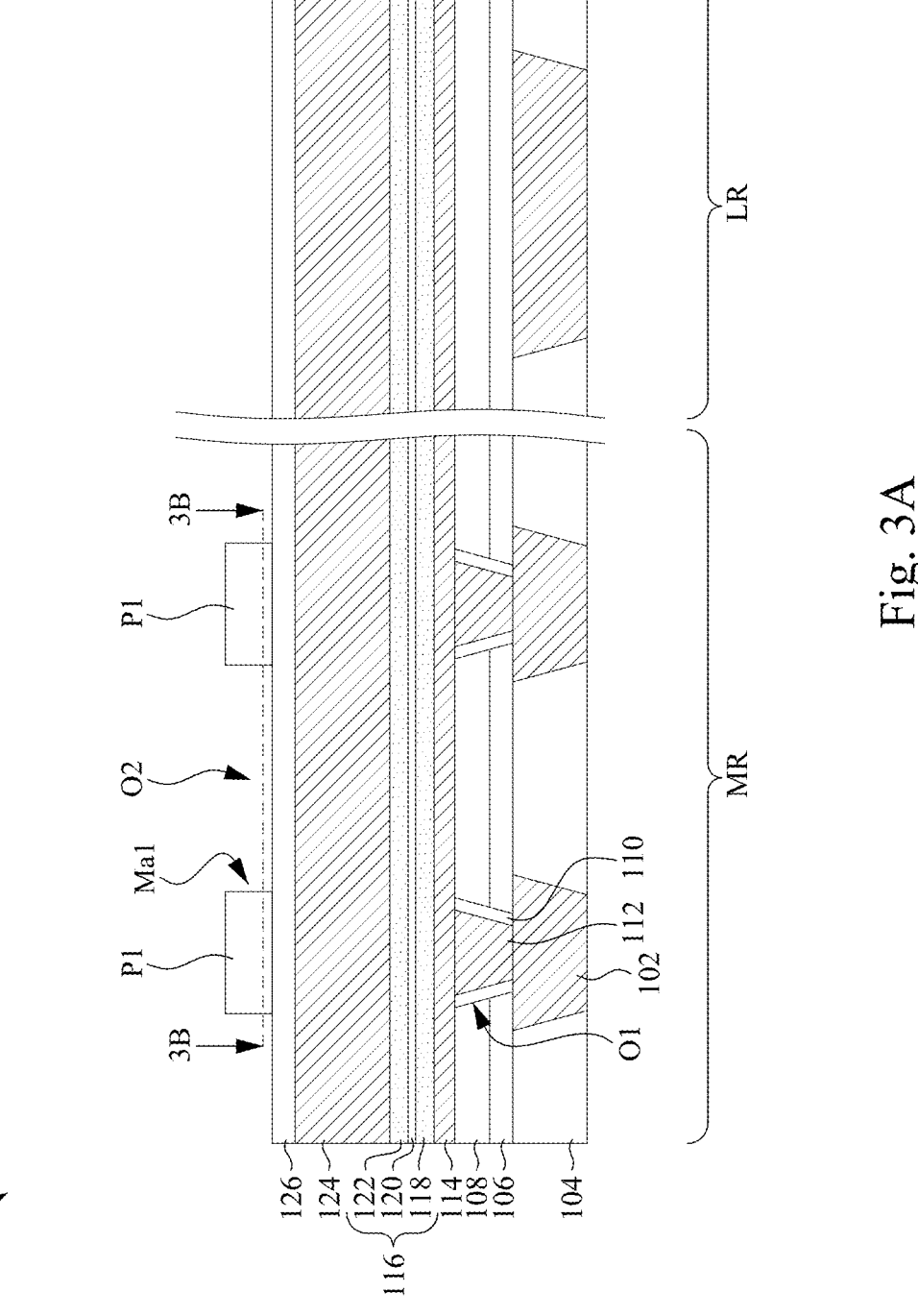

As illustrated in the cross-sectional view of FIG. 3A, after the barrier layers 110 and the BEVAs 112 are formed in the via openings O1, a bottom electrode (BE) layer 114 is formed extending across the dielectric layer 108, the barrier layers 110, and the BEVAs 112 by using suitable deposition techniques, such as PVD, CVD, ALD, the like, or combinations thereof. The bottom electrode layer 114 spans the embedded memory region MR and the logic region LR. The bottom electrode layer 114 can be a single-layered structure or a multi-layered structure. In some embodiments, the bottom electrode layer 114 includes a conductive nitride that has a magnetic property suitable for the operation of the subsequently formed MTJ stacks. For example, the conductive nitride material of the bottom electrode layer 114 does not affect pinning the magnetic polarization of a subsequently formed pinned layer of the MTJ stacks. In some embodiments, the bottom electrode layer 114 is made of TaN, TiN, or combinations thereof. Formation of the bottom electrode layer 114 may be exemplarily performed using CVD, PVD, ALD, the like, or combinations thereof. In some embodiments, the BEVAs 112 are made of a material that matches the electrical and magnetic properties of the bottom electrode layer 114. For example, when the bottom electrode layer 114 is made of TaN, TiN, or combinations thereof, the BEVAs 112 can be made of TiN.

As illustrated in the cross-sectional view of FIG. 3A, after the bottom electrode layer 114 is formed, a magnetic tunnel junction (MTJ) layer 116 is formed over the bottom electrode layer 114 and spans the embedded memory region MR and the logic region LR. The MTJ layer 116 includes a lower magnetic layer 118, a tunnel barrier layer 120 and an upper magnetic layer 122 formed in sequence over the bottom electrode layer 114. The lower magnetic layer 118, the tunnel barrier layer 120 and the upper magnetic layer 122 collectively form a magnetic tunnel junction (MTJ) and are thus in combination referred to as an MTJ layer 116 in some embodiments of the present disclosure.

In some embodiments, the lower magnetic layer 118 is a multi-layered structure that includes an anti-ferromagnetic material (AFM) layer over the bottom electrode layer 114 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), or iron manganese (FeMn). An exemplary formation method of the AFM layer includes sputtering, PVD, ALD or the like.

The ferromagnetic pinned layer in the lower magnetic layer 118 forms a permanent magnet and exhibits strong interactions with magnets. A direction of a magnetic moment of the ferromagnetic pinned layer can be pinned by the anti-ferromagnetic material (AFM) layer and is not changed during operation of a resulting MTJ stack fabricated from the MTJ layer 116, e.g., during write operations of resultant MRAM cells. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD or ALD. In some embodiments, the ferromagnetic pinned layer includes a multi-layered structure.

The tunnel barrier layer 120 is formed over the lower magnetic layer 118. The tunnel barrier layer 120 can also be referred to as a tunneling layer, which is thin enough that electrons are able to tunnel through the tunnel barrier layer when a biasing voltage is applied to a resulting MTJ stack fabricated from the MTJ layer 116. In certain embodiments, the tunnel barrier layer 120 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 120 includes sputtering, PVD, ALD or the like.

The upper magnetic layer 122 is formed over the tunnel barrier layer 120. The upper magnetic layer 122 is a ferromagnetic free layer in some embodiments. More specifically, a direction of a magnetic moment of the upper magnetic layer 122 is not pinned because there is no anti-ferromagnetic material in the upper magnetic layer 122. Therefore, the magnetic orientation of this layer is adjustable, thus the layer is referred to as a free layer. In some embodiments, the direction of the magnetic moment of the upper magnetic layer 122 is free to rotate parallel or anti-parallel to the pinned direction of the magnetic moment of the ferromagnetic pinned layer in the lower magnetic layer 118. The upper magnetic layer 122 may include a ferromagnetic material similar to the material in the ferromagnetic pinned layer in the first magnetic layer 151. Since the upper magnetic layer 122 has no anti-ferromagnetic material while the lower magnetic layer 118 has an anti-ferromagnetic material therein, the lower and upper magnetic layers 118 and 122 have different materials. In certain embodiments, the upper magnetic layer 122 includes cobalt, nickel, iron or boron. An exemplary formation method of the upper magnetic layer 122 includes sputtering, PVD, ALD or the like. Although in the depicted embodiment the ferromagnetic free layer 122 is the topmost layer in the MTJ layer 116, the MTJ layer 116 further includes an additional MgO layer over the free layer 122, and a capping layer (e.g., TaN or TiN) over the additional MgO layer in some other embodiments.

After the MTJ layer 116 is formed, a top electrode layer 124 is formed over the MTJ layer 116. The top electrode layer 124 also spans both the embedded memory region MR and the logic region LR as illustrated in the cross-sectional view of FIG. 3A. The top electrode layer 124 includes a conductive material. In some embodiments, the top electrode layer 124 is similar to the bottom electrode layer 114 in terms of composition. In some embodiments, the top electrode layer 124 comprises titanium (Ti), tantalum (Ta), platinum (Pt), ruthenium (Ru), tungsten (W), aluminum (Al), copper (Cu), the like or combinations thereof. An exemplary formation method of the top electrode layer 124 includes sputtering, PVD, ALD or the like.

Next, a hard mask layer 126 is formed over the top electrode layer 124. In some embodiments, the hard mask layer 126 is formed from a dielectric material. For example, the hard mask layer 126 may be silicon carbide (SiC), silicon oxynitride (SiON), silicon nitride (SiN), silicon dioxide ($SiO_2$), the like, and/or combinations thereof. The hard mask layer 126 may be formed by any suitable deposition techniques, such as CVD, ALD, PVD, the like, and/or combinations thereof.

The cross-sectional view of FIG. 3A also illustrates formation of a patterned mask layer Ma1 over the hard mask layer 126. The patterned mask layer Ma1 may comprise an organic material, such as a photoresist material, and may be formed using a spin-on coating process, followed by patterning the photoresist material to form a plurality of holes O2 extending through the patterned mask layer Ma1 using suitable lithography techniques, resulting in a plurality of patterned masks P1 vertically overlapping the respective BEVAs 112. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. Thus, the patterned masks P1 separated by openings O2 as illustrated in FIG. 3A are formed in the patterned photoresist layer Ma1. The step of forming the patterned masks P1 can be interchangeably referred to as a first photolithography process in MRAM fabrication.

Referring to FIG. 3A, a top view of FIG. 3A's embedded memory region MR as indicated in the cut-away line 3B-3B shown in FIG. 3A in accordance with some embodiments is provided. Top view of FIG. 3B corresponds to an image taken using an imaging tool (e.g., SEM, TEM, or the like) along the cut-away line 3B-3B shown in FIG. 3A. In some embodiments, when viewed from above the patterned masks P1 each have a substantially circular pattern (e.g., circular/ elliptical pattern) with a diameter D1.

Figure 4A:
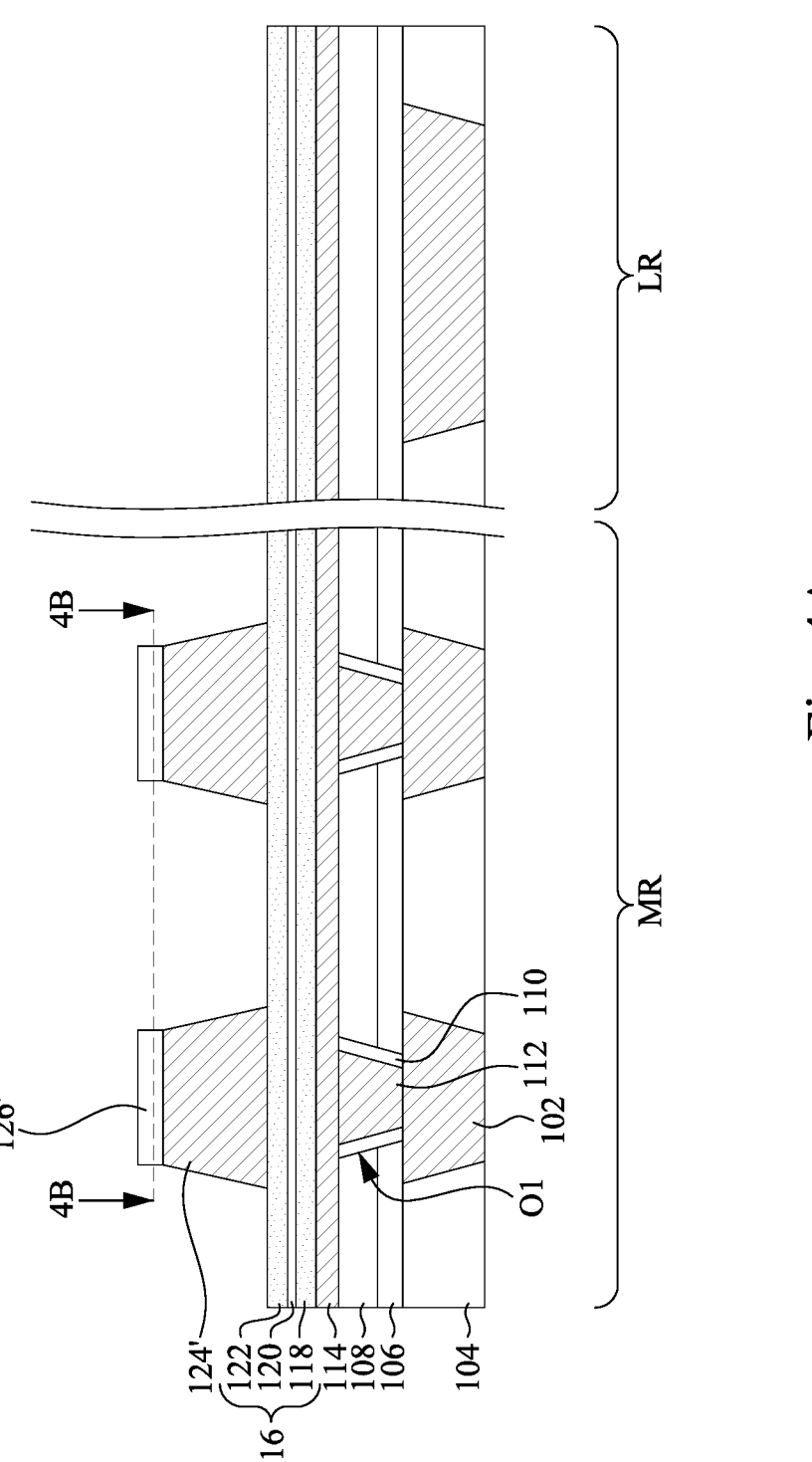
Figure 4B:
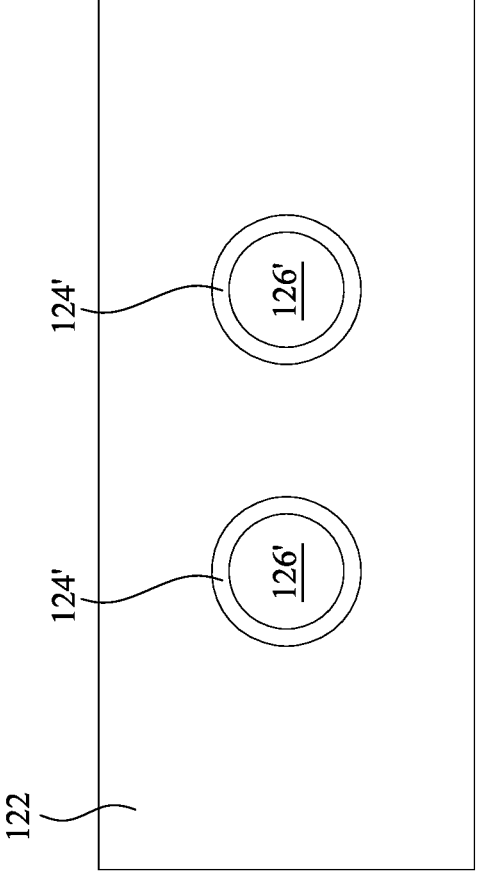
Figure 4B:

After forming the patterned mask layer Ma1, a patterning process is performed on the hard mask layer 126 and the top electrode layer 124 to transfer the pattern of the patterned masks P1 to the underlying hard mask layer 126 and the top electrode layer 124, resulting in patterned hard masks 126' and patterned top electrodes 124' under the respective patterned hard masks 126', as illustrated in FIGS. 4A and 4B. This step can be interchangeably referred to as a top electrode patterning process. FIG. 4A is a cross-sectional view of the integrated circuit structure 100 after the top electrode patterning process is completed, and FIG. 4B is a top view of FIG. 4A's embedded memory region MR as indicated in the cut-away line 4B-4B shown in FIG. 4A, in accordance with some embodiments of the present disclosure.

In some embodiments, the top electrode patterning process comprises one or more etching processes, where the patterned mask layer Ma1 is used as an etch mask. The one or more etching processes may include wet etching processes, anisotropic dry etching processes, or combinations thereof, and may use one or more etchants that etches the hard mask layer 126 and the top electrode layer 124 at a faster etch rate than it etches the patterned mask layer Ma1. For example, the hard mask layer 126 and the top electrode layer 124 may be patterned using a dry etching process that may use chlorine-containing gas (e.g., $Cl_2$, $CHCl_3$, $CCl_4$, and/or $BCl_3$), other suitable gases and/or plasmas, and/or combinations thereof. The dry etching process may include, for example, reactive ion etch (RIE), inductively coupled plasma (ICP) etch, transformer coupled plasma (TCP) etch, electron cyclotron resonance (ECR) etch, the like, or combinations thereof. The patterning process may include a multiple-step etching to gain etch selectivity, flexibility and desired etch profile. The etchant and etch conditions are chosen to selectively etch the hard mask layer 126 and the top electrode layer 124 without substantially etching the upper magnetic layer 122 (i.e., ferromagnetic free layer). Thus, the upper magnetic layer 122 servers as an etch stop layer to relax etch process constraints and improve the etch process window in the step of patterning the top electrode layer 124.

After the top electrode patterning process is completed, the patterned mask layer Ma1 is removed, for example, using a plasma ash process. In some embodiments, a plasma ash process is performed such that the temperature of the photoresist mask Ma1 is increased until the photoresist mask Ma1 experiences a thermal decomposition and may be removed. However, any other suitable process, such as a wet strip, may be utilized.

Because the hard mask layer 126 and the top electrode layer 124 are patterned using the mask layer Ma1 as an etch mask, the patterned hard masks 126' and the patterned top electrodes 124' inherit the patterns of the patterned masks P1 (illustrated in FIGS. 3A and 3B), and thus from the top view of FIG. 4B, the patterned hard masks 126' and the patterned top electrodes 124' each have a circular/elliptical pattern, if the patterned masks P1 have circular/elliptical top-view profiles. Moreover, in some embodiments, the top electrodes 124' may have tapered sidewalls as illustrated in the cross-sectional view of FIG. 4A due to the nature of dry etching process. More specifically, the top electrodes 124' have a maximum diameter at bottommost positions of the top electrodes 124', and the maximum diameter is greater than a maximum diameter of the hard masks 126'. In that case, when viewed from above the top electrodes 124' form larger circular/elliptical patterns than the hard masks 126', and more particularly, the top electrodes 124' and the hard masks 126' may form concentric circles/ellipses as illustrated in the top view of FIG. 4B.

Figure 5A:
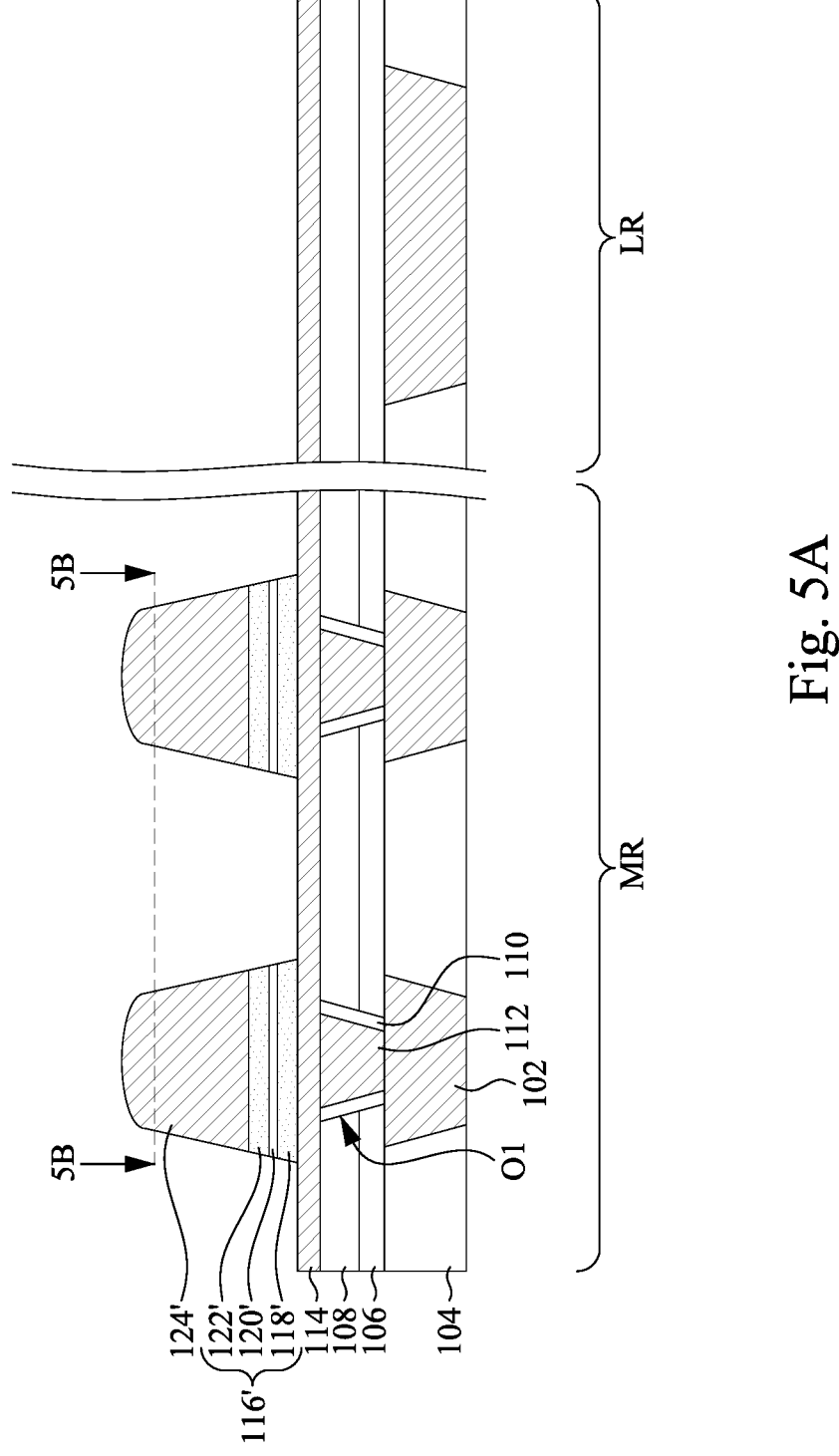
Figure 5B:
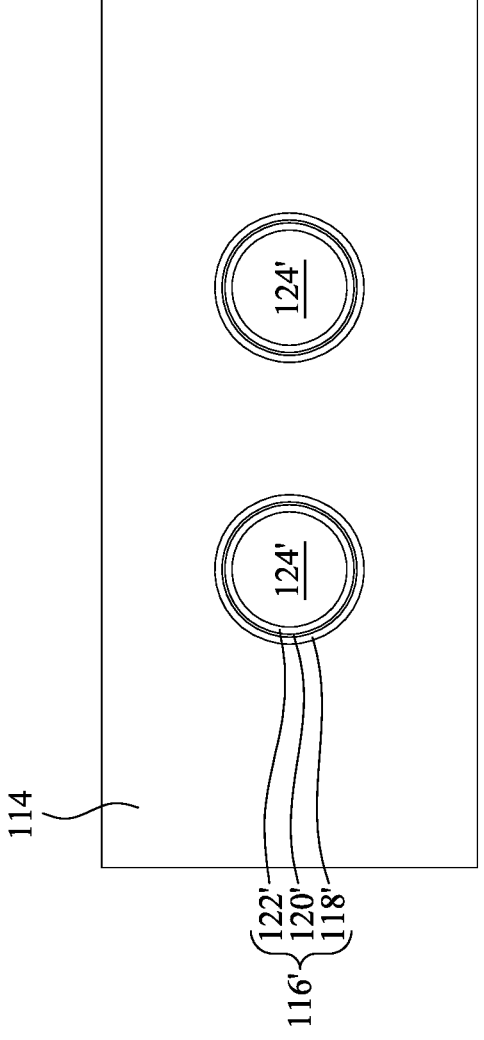

After the top electrode patterning process is completed, another patterning process begins on the MTJ layer 116 to transfer the pattern of the top electrodes 124' to the MTJ layer 116, resulting in patterned MTJ stacks (interchangeably referred to as MTJ structures) 116' under the respective top electrodes 124', as illustrated in FIGS. 5A and 5B. This patterning step can be interchangeably referred to as an MTJ patterning process. FIG. 5A is a cross-sectional view of the integrated circuit structure 100 after the MTJ patterning process is completed, and FIG. 5B is a top view of FIG. 5A's embedded memory region MR as indicated in the cut-away line 5B-5B shown in FIG. 5A, in accordance with some embodiments of the present disclosure.

In some embodiments, the MTJ patterning process comprises one or more etching processes, where the patterned hard masks 126' (illustrated in FIGS. 4A and 4B) and/or top electrodes 124' are used as an etch mask. The one or more etching processes may include wet etching processes, anisotropic dry etching processes, or combinations thereof, and may use one or more etchants that etches the MTJ layer 116 at a faster etch rate than it etches the patterned hard masks 126'. For example, the MTJ layer 116 may be etched using alkanols, such as methanol ($CH_3OH$), ethanol, and butanol), or a carbon oxide(s) combined with an ammonia-containing compound(s) (e.g. $CO+NH_3$). The dry etching process may include, for example, RIE, ICP etch, TCP etch, ECR etch, the like, or combinations thereof. The patterning process may include a multiple-step etching to gain etch selectivity, flexibility and desired etch profile. The etchant and etch conditions are chosen to selectively etch the upper magnetic layer 122, the tunnel barrier layer 120 and the lower magnetic layer 118 without substantially etching the bottom electrode layer 114. Thus, the bottom electrode layer 114 may server as an etch stop layer to relax etch process constraints and improve the etch process window in the step of patterning the MTJ layer 116.

In some embodiments, the hard masks 126' are consumed during the MTJ patterning process, and thus top surfaces of the top electrodes 124' may be exposed before the MTJ patterning process is completed. In that case, the top electrodes 124' may be etched by the MTJ patterning process, resulting in the etched top electrodes 124' having round top surfaces as illustrated in the cross-sectional view of FIG. 5A. However, because the top electrodes 124' is covered by the hard masks 126' in the initial stage of the MTJ patterning process, excessive height reduction in the top electrodes 124' can still be prevented by using the hard masks 126'.

Because the MTJ layer 116 is patterned using the top electrodes 124' as an etch mask, the patterned upper magnetic layer 122', the patterned tunnel barrier layer 120' and the patterned lower magnetic layer 118' in each MTJ stack 116' inherit the pattern of the top electrode 124', and thus from the top view of FIG. 5B, the patterned MTJ stacks 116' each have a circular/elliptical pattern, if the top electrodes 124' have circular/elliptical top-view profiles. Moreover, in some embodiments, the MTJ stacks 116' may have tapered sidewalls as illustrated in the cross-sectional view of FIG. 5A due to the nature of dry etching process. In a MTJ stack 116', the lower magnetic layer 118', the tunnel barrier layer 120', and the upper magnetic layer 122' may have tapered sidewalls. More particularly, the lower magnetic layer 118' has a width (or diameter if it has a circular top-view profile) decreasing as a distance from the bottom electrode layer 114 increases, the tunnel barrier layer 120' has a width (or diameter if it has a circular top-view profile) decreasing as a distance from the lower magnetic layer 118' increases, and the upper magnetic layer 122' has a width (or diameter if it has a circular top-view profile) decreasing as a distance from the tunnel barrier layer 120' increases. Moreover, the maximum width of the lower magnetic layer 118' is greater than the maximum width of the tunnel barrier layer 120', and the maximum width of the tunnel barrier layer 120' is greater than the maximum width of the upper magnetic layer 122'. As a result, when viewed in a top view as illustrated in FIG. 5B, the upper magnetic layer 122' may form a larger circular/elliptical pattern than the top electrode 124', the tunnel barrier layer 120' may form a larger circular/elliptical pattern than the upper magnetic layer 122', and the lower magnetic layer 118' may form a larger circular/elliptical pattern than the tunnel barrier layer 120'. In some embodiments, the top electrode 124', the upper magnetic layer 122', the tunnel barrier layer 120', and the lower magnetic layer 118' may form concentric circles/ellipses as illustrated in the top view of FIG. 5B.

Figure 6:
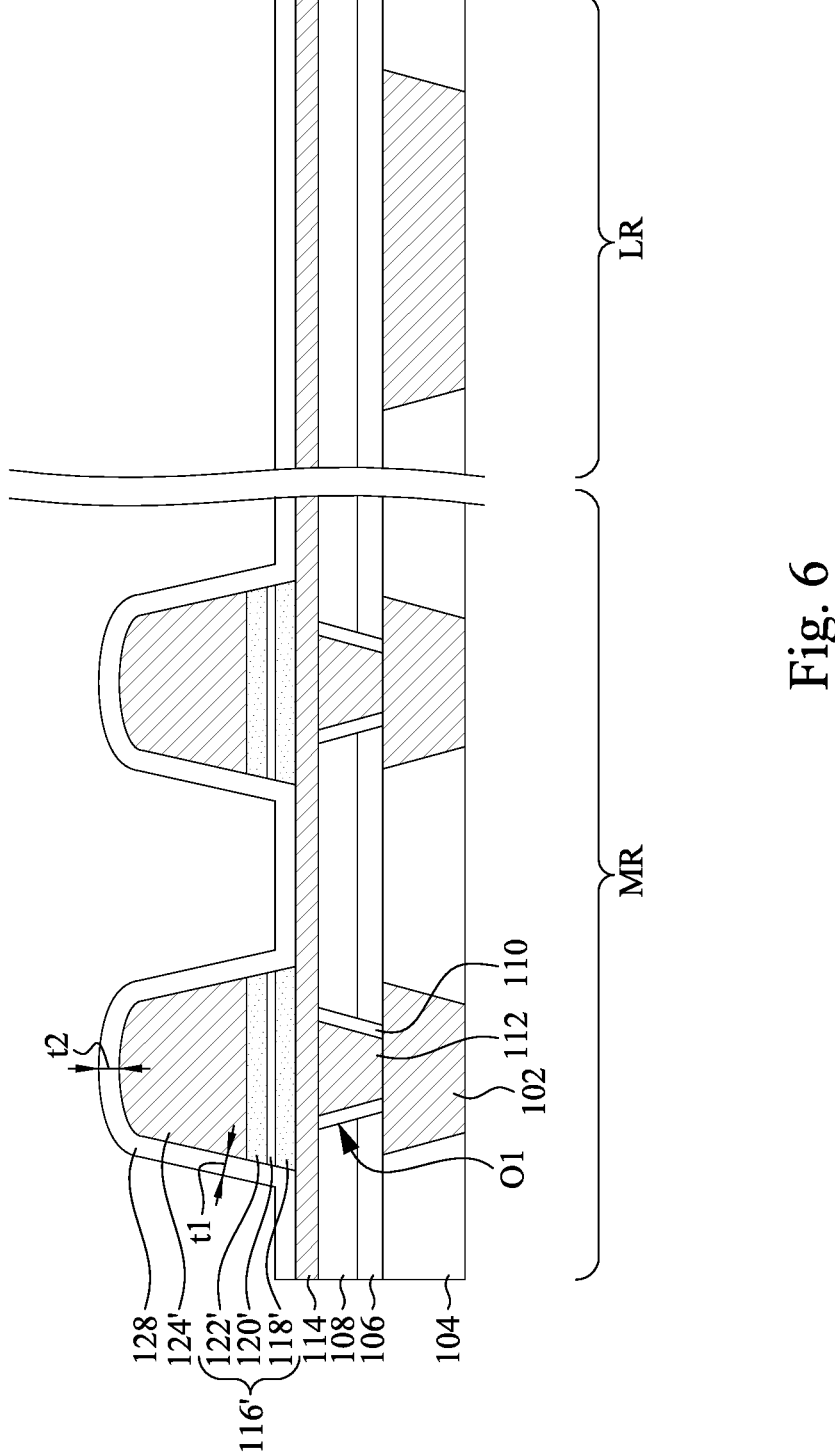

Once the MTJ patterning process has been completed, a spacer layer 128 is formed over the round top surfaces of the top electrodes 124' and the tapered sidewalls of the top electrodes 124' and the MTJ stacks 116', and also over the top surface of the bottom electrode layer 114. The resultant structure is illustrated in FIG. 6. The spacer layer 128 spans both the embedded memory region MR and the logic region LR. The spacer layer 128 in some embodiments may include SiN, but in other embodiments may include SiC, SiON, silicon oxycarbide (SiOC), the like, and/or combinations thereof. The spacer layer 128 may be formed using CVD, PVD, ALD, the like, and/or combinations thereof. The spacer layer 128 may be formed as a substantially conformal layer, and hence a thickness t1 of the slanted portions of the spacer layer 128 on tapered sidewalls of the top electrodes 124' and the MTJ stacks 116' is close to a thickness t2 of the horizontal portion of the spacer layer 128. For example, thicknesses t1 and t2 may have a difference smaller than about 20 percent of thickness t2.

Figure 7A:
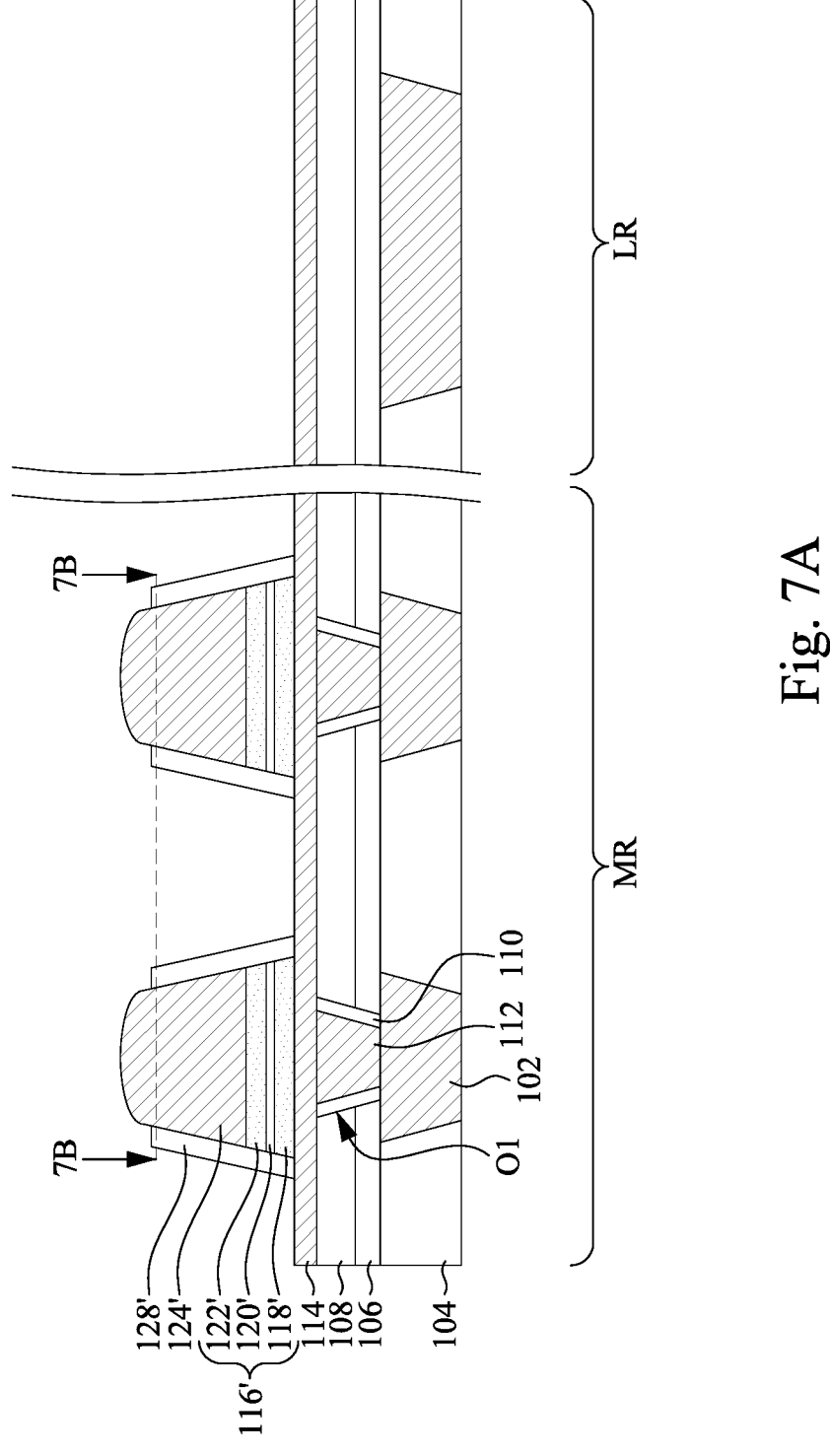
Figure 7B:
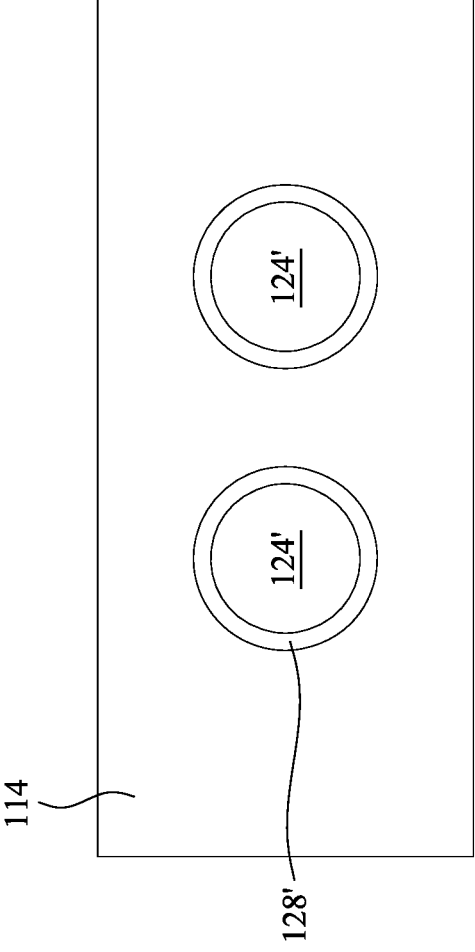
Figure 7B:

Next, an etching process is performed on the spacer layer 128 to remove horizontal portions from the bottom electrode layer 114 and also remove curved portions from round top surfaces of the top electrodes 124', while leaving portions of the spacer layer 128 on tapered sidewalls of the top electrodes 124' and the MTJ stacks 116' to serve as sidewall spacers 128', as illustrated in FIGS. 7A and 7B. This step can be interchangeably referred to as a self-aligned spacer (SPA) etching process, because the resultant sidewall spacers 128' can be formed self-aligned to the MTJ stacks 116' and the top electrodes 124' without an additional photolithography process. FIG. 7A is a cross-sectional view of the integrated circuit structure 100 after the SPA etching process is completed, and FIG. 7B is a top view of FIG. 7A's embedded memory region MR as indicated in the cut-away line 7B-7B shown in FIG. 7A, in accordance with some embodiments of the present disclosure.

In some embodiments, the SPA etching process may include an anisotropic dry etch process, which etches the spacer layer 128 disposed over the top surfaces of the top electrodes 124' and the bottom electrode layer 114, but does not substantially etch the sidewall spacers 128' due to the controlled anisotropy of the SPA etching process. The SPA etching process may also include a selective anisotropic dry etch process, which etches the spacer layer 128 at a faster etch rate than etching the top electrodes 124' and the bottom electrode layer 114. By way of example and not limitation, the SPA etching process includes a plasma dry etching process using a fluorine-based chemistry, such as $CF_4$, $SF_6$, $CH_2F_2$, $CHF_3$, and/or $C_2F_6$ and other suitable gases.

As illustrated in FIGS. 7A and 7B, the SPA etching process stops before the bottom electrode layer 114 is broken through. More specifically, after the SPA etching process is completed, the bottom electrode layer 114 is still substantially intact. If the SPA etching continues to etch the metal material(s) in the bottom electrode layer 114 until the bottom electrode layer 114 is patterned, the SPA etching would also etch the top electrodes 124', leading to excessive height reduction in the top electrodes 124'. On the contrary, because the SPA etching does not continue to etch metal materials of the bottom electrode layer 114, the SPA etching process can result in no or negligible etch amount on the top electrodes 124', which in turn alleviates or prevents height reduction in the top electrodes 124' caused by the SPA etching process. As a result, the round top surfaces of the top electrodes 124' may remain substantially intact after the SPA etching.

Because the sidewall spacers 128' are self-aligned to sidewalls of the top electrodes 124' and MTJ stacks 116', the sidewall spacers 128' each is a single continuous annular (i.e., ring-shaped) coating layer with a circular/elliptical outer surface when viewed in a top view as illustrated in FIG. 7B.

Figure 8:
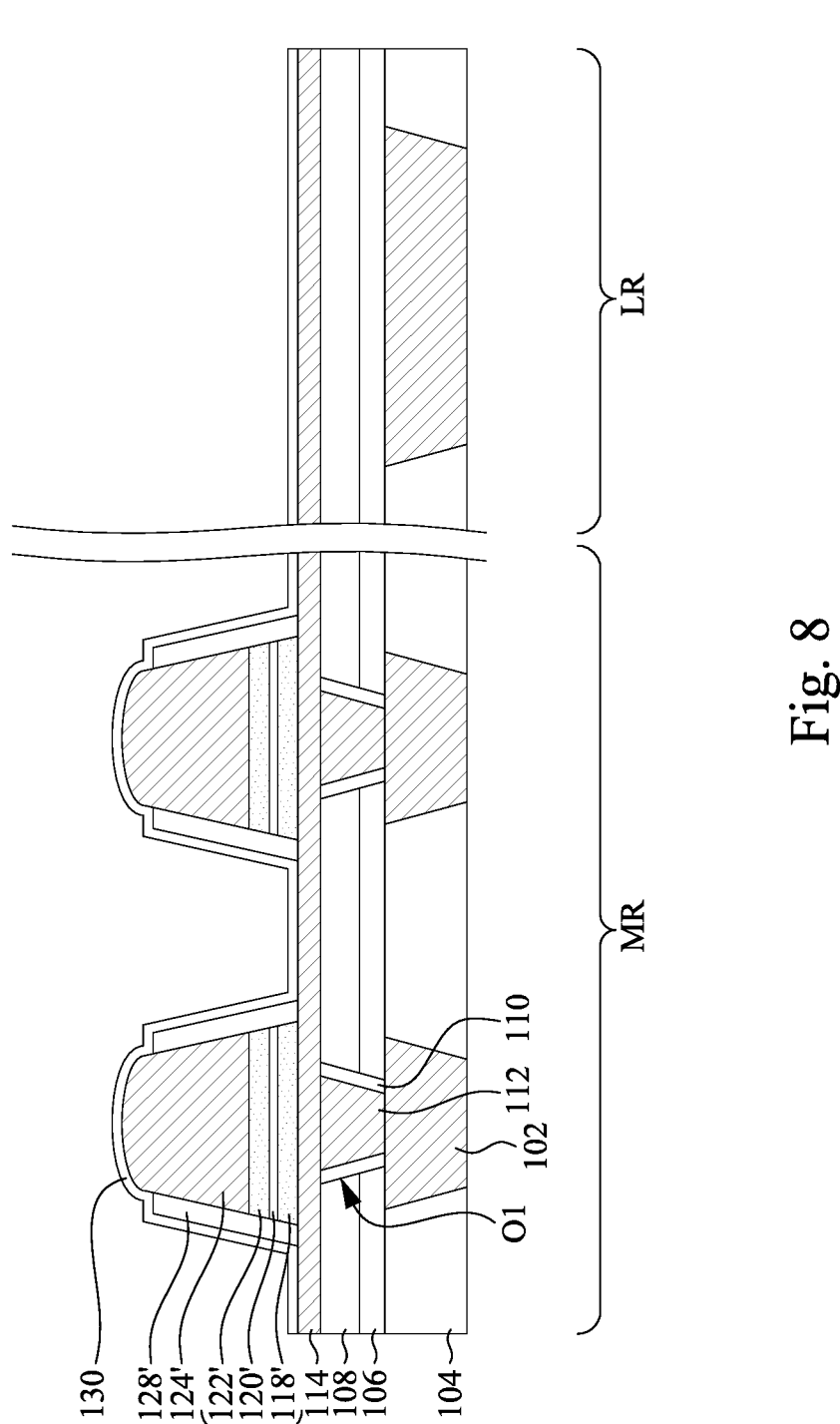

After the SPA patterning process has been completed, another etch stop layer 130 is formed as a blanket layer to cover the structure shown in FIGS. 7A-7B. The resulting structure is illustrated in FIG. 8. The etch stop layer 130 spans both the embedded memory region MR and the logic region LR. In some embodiments, the etch stop layer 130 is formed of an aluminum-containing dielectric material, such as aluminum nitride (AlN), aluminum oxide ($AlO_x$), aluminum oxynitride, other aluminum-containing dielectric materials, or combinations thereof. The etch stop layer 130 may be formed as a substantially conformal layer with a uniform thickness everywhere. The etch stop layer 130 may serve to protect the top electrodes 124' from a subsequent trench etching process for forming metal lines, which in turn alleviates or prevents height reduction in the top electrodes 124'. If the etch stop layer 130 is excessively thick, the gap between neighboring MTJ stacks 116' may be too small to be filled, thus leading to increased challenge on a subsequent deposition process of forming an IMD layer. If the etch stop layer 130 is excessively thin, the subsequent trench etching process may result in unsatisfactory height reduction, which in turn would lead to tightened landing window for metal lines landing on the top electrodes.

Figure 9A:
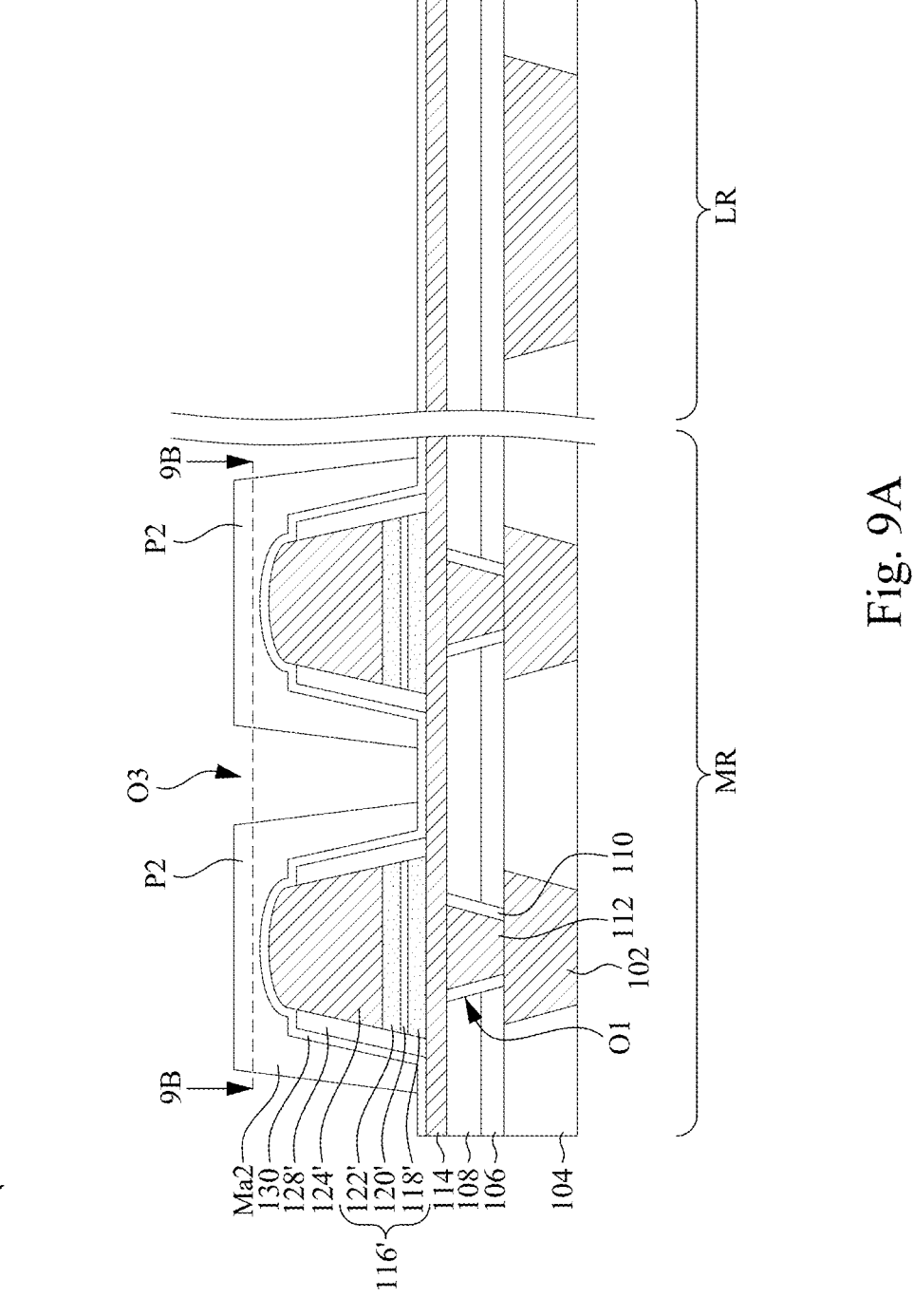
Figure 9B:
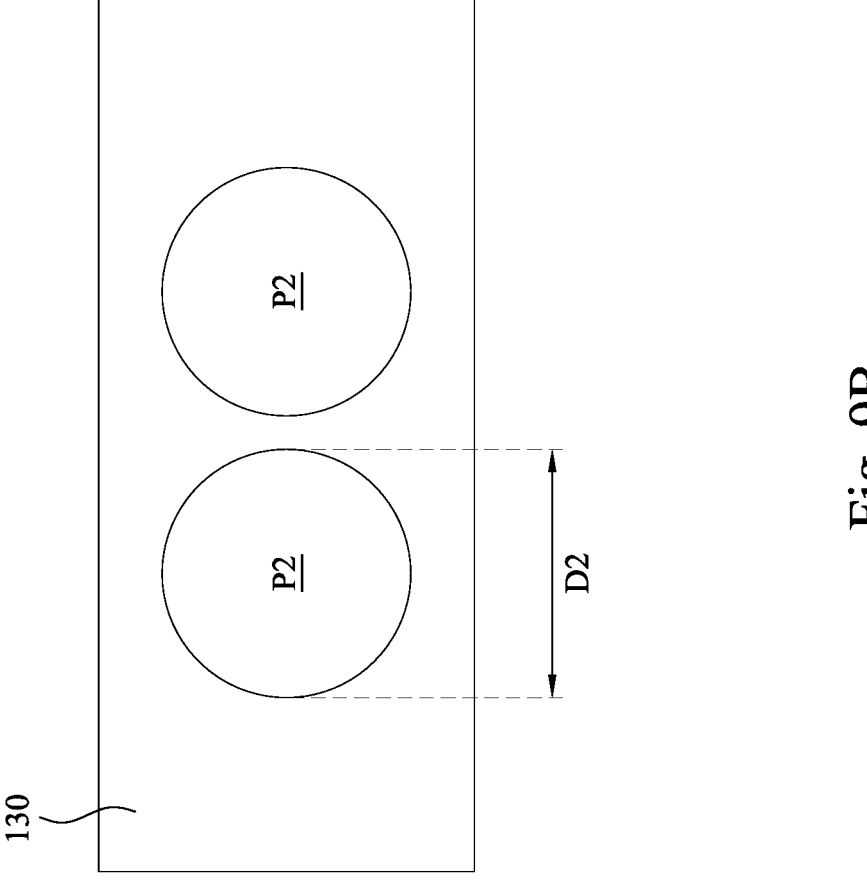
Figure 9B:

After the etch stop layer 130 has been formed, another patterned mask layer Ma2 is formed over the etch stop layer 130, as illustrated in FIGS. 9A and 9B. This step can be interchangeably referred to as a second photolithography process in MRAM fabrication. FIG. 9A is a cross-sectional view of the integrated circuit structure 100 after the second photolithography process is completed, and FIG. 9B is a top view of FIG. 9A's embedded memory region MR as indicated in the cut-away line 9B-9B shown in FIG. 9A, in accordance with some embodiments of the present disclosure.

Figure 3B:
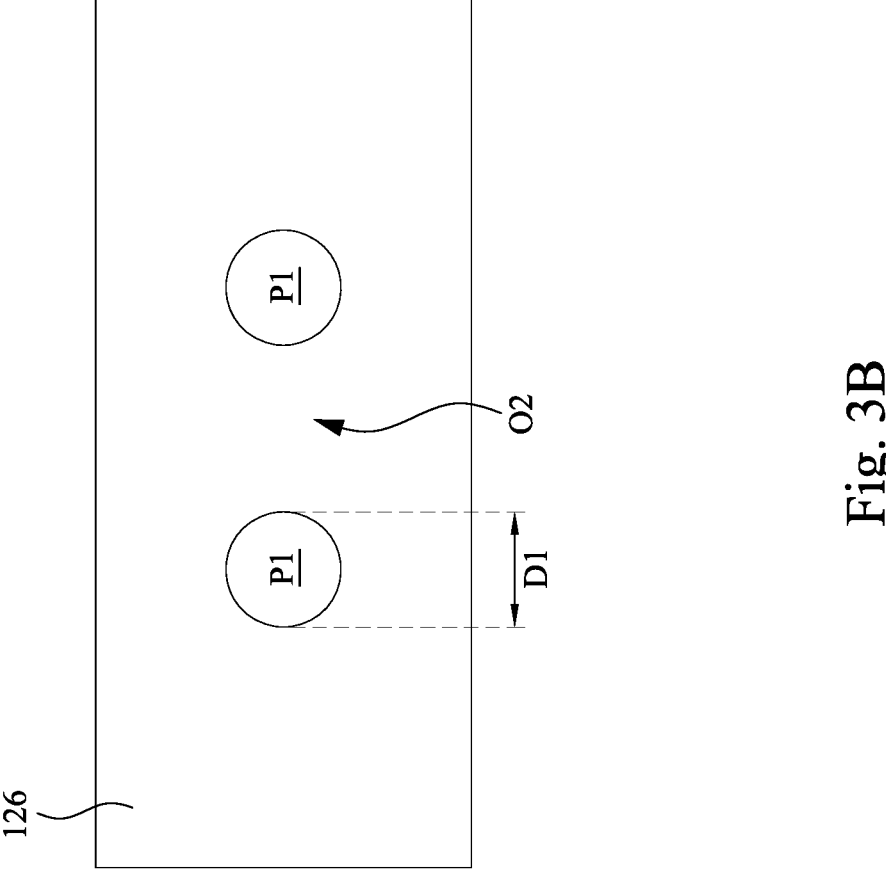
Figure 3B:

The patterned mask layer Ma2 may comprise an organic material, such as a photoresist material, and may be formed using a spin-on coating process, followed by patterning the photoresist material to forming a plurality of holes O3 extending through the patterned mask layer Ma2 using suitable lithography techniques, resulting in a plurality of patterned masks P2 wrapping around the respective top electrodes 124' and the respective MTJ stacks 116'. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. Thus, the patterned masks P2 separated by openings O3 as illustrated in FIG. 9A are formed in the patterned photoresist layer Ma2. As illustrated in the top view of FIG. 9B, the patterned masks P2 each have a circular/elliptical pattern with a diameter D2. The diameter D2 of the patterned masks P2 is greater than the diameter D1 of the patterned masks P1 as illustrated in FIGS. 3A and 3B. This is because that the first photolithography process performed at the stage of FIGS. 3A and 3B serves to define top electrodes, and the second photolithography process performed at the stage of FIGS. 9A and 9B serves to provide masks covering the top electrodes. By way of example and not limitation, the diameter D2 of the patterned masks P2 is greater than the diameter D1 of the patterned masks P1.

Figure 10A:
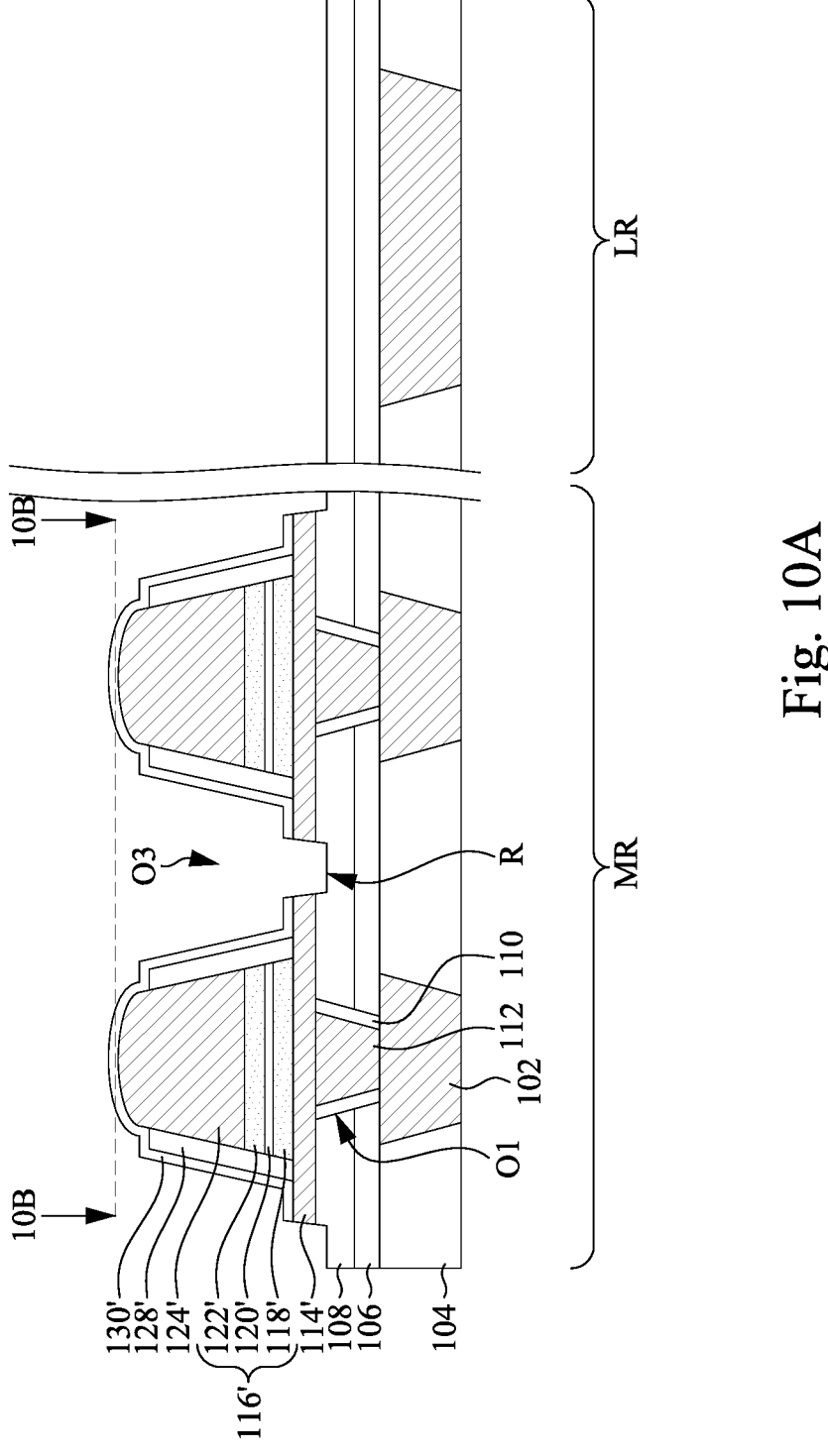
Figure 10B:
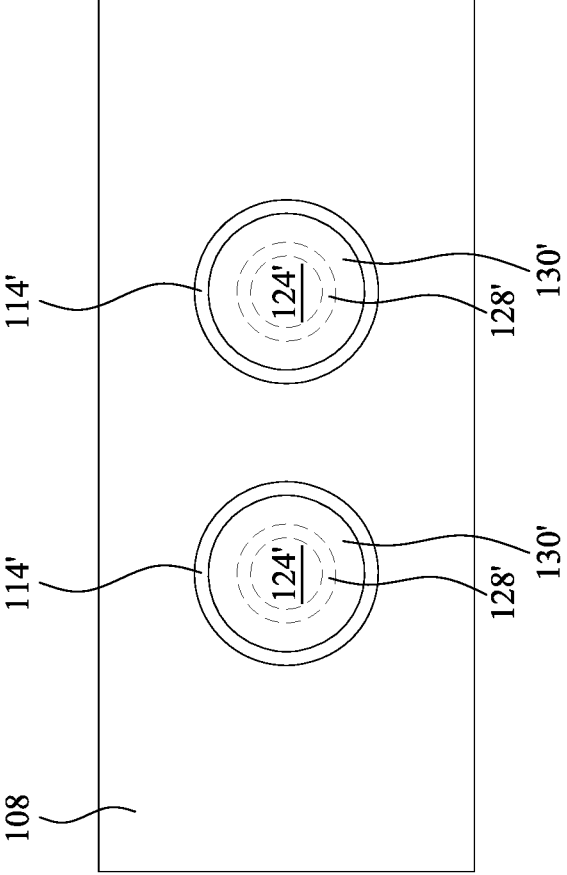
Figure 10B:

After forming the patterned mask layer Ma2, a patterning process is performed on the etch stop layer 130 and the bottom electrode layer 114 to transfer the pattern of the patterned masks P2 to the underlying etch stop layer 130 and the bottom electrode layer 114, resulting in patterned etch stop layers 130' and patterned bottom electrodes 114' under the respective patterned etch stop layers 130', as illustrated in FIGS. 10A and 10B. This step can be interchangeably referred to as a bottom electrode patterning process. FIG. 10A is a cross-sectional view of the integrated circuit structure 100 after the bottom electrode patterning process is completed, and FIG. 10B is a top view of FIG. 10A's embedded memory region MR as indicated in the cut-away line 10B-10B shown in FIG. 10A, in accordance with some embodiments of the present disclosure.

In some embodiments, the bottom electrode patterning process comprises one or more etching processes, where the patterned mask layer Ma2 is used as an etch mask. The one or more etching processes may include wet etching processes, anisotropic dry etching processes, or combinations thereof, and may use one or more etchants that etches the etch stop layer 130 and the bottom electrode layer 114 at a faster etch rate than it etches the patterned mask layer Ma2. For example, the etch stop layer 130 and the bottom electrode layer 114 may be patterned using a dry etching process that may use chlorine-containing gas (e.g., $Cl_2$, $CHCl_3$, $CCl_4$, and/or $BCl_3$), other suitable gases and/or plasmas, and/or combinations thereof. The dry etching process may include, for example, RIE, ICP etch, TCP etch, ECR etch, the like, or combinations thereof. The bottom electrode patterning process may include a multiple-step etching to gain etch selectivity, flexibility and desired etch profile. The etchant and etch conditions are chosen to selectively etch the etch stop layer 130 and the bottom electrode layer 114 without substantially etching the dielectric layer 108. Thus, the dielectric layer 108 servers as an etch stop layer to relax etch process constraints and improve the etch process window in the step of patterning the bottom electrode layer 114.

In some embodiments, the bottom electrode patterning process uses the same etchant as the top electrode patterning process. For example, both the bottom electrode patterning process and the top electrode patterning process uses a chlorine-based etchant, such as chlorine-containing gas (e.g., $Cl_2$, $CHCl_3$, $CCl_4$, and/or $BCl_3$) and/or plasma. Moreover, because both the bottom electrode patterning process and the top electrode patterning process involve a photolithography process to define targeted geometries, fabrication of the MTJ cells can be interchangeably referred to as a double MTJ cell patterning method.

In some embodiments, the bottom electrode patterning process may slightly etch the dielectric layer 108, resulting in recessed regions R in the dielectric layer 108. As a result, the dielectric layer 108 has a stepped top surface with higher steps contacting the bottom electrodes 114' and lower steps separated from the bottom electrodes 114', wherein the lower steps further span the logic region LR. Stated another way, the dielectric layer 108 has a smaller thickness within the logic region than below the bottom electrodes 114'. In the embedded memory region MR, a BEVA 112, a bottom electrode 114' over the BEVA 112, a MTJ stack 116' over the bottom electrode 114', and a top electrode 124'' over the MTJ stack 116' are in combination referred to as a MRAM cell. Two MRAM cells are illustrated in the embodiments of FIGS. 10A and 10B for the sake of brevity and clarity. In some other embodiments, the integrated circuit includes more than two MRAM cells arranged in rows and columns when viewed from above.

After the bottom electrode patterning process is completed, the patterned mask layer Ma2 is removed, for example, using a plasma ash process. In some embodiments, a plasma ash process is performed such that the temperature of the photoresist mask Ma2 is increased until the photoresist mask Ma2 experiences a thermal decomposition and may be removed. However, any other suitable process, such as a wet strip, may be utilized.

Because the etch stop layer 130 and the bottom electrode layer 114 are patterned using the mask layer Ma2 as an etch mask, the patterned etch stop layers 130' and the patterned bottom electrodes 114' inherit the patterns of the patterned masks P2 (illustrated in FIGS. 9A and 9B), and thus from the top view of FIG. 10B, the patterned etch stop layers 130' and the patterned bottom electrodes 114' each have a circular/elliptical pattern, if the patterned masks P2 have circular/elliptical top-view profiles. Moreover, in some embodiments, the bottom electrodes 114' may have tapered sidewalls as illustrated in the cross-sectional view of FIG. 10A due to the nature of dry etching process. Similarly, the etch stop layers 130' have tapered edges aligned with the respective tapered sidewalls of the bottom electrodes 114'. In greater detail, the bottom electrode 114' has a width (or diameter if it has a circular top-view profile) decreasing as a distance from the BEVA 112 increases. As a result, when viewed in a top view as illustrated in FIG. 10B, the bottom electrode 114' may form a larger circular/elliptical pattern than the etch stop layer 130'. In some embodiments, the etch stop layer 130' and the bottom electrode 114' may form concentric circles/ellipses as illustrated in the top view of FIG. 10B. In some embodiments, the sidewall spacer 128' forms a ring-shaped pattern, the bottom electrode 114' forms a substantially circular pattern having a diameter greater than an outside diameter of the ring-shaped pattern formed from the sidewall spacer 128'. Moreover, the substantially circular pattern formed from the bottom electrode 114' may be concentric around the ring-shaped pattern formed from the sidewall spacer 128'.

After the bottom electrode patterning process has been completed, another IMD layer 132 is deposited spanning the embedded memory region MR and the logic region LR. The resultant structure is illustrated in the cross-sectional view of FIG. 11. The IMD layer 132 is made of one or more low-k dielectric materials having k value (i.e., dielectric constant), for example, lower than about 4.0 or even 2.0 disposed between such conductive features. In some embodiments, the IMD layers 132 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like. In some embodiments, the IMD layer 132 is made of an extreme low-k (ELK) dielectric material with a dielectric constant less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 132 is made of the same material as the IMD layer 104. The IMD layer 132 can be formed on wafer by any suitable methods, such as spin-on coating, chemical vapor deposition (CVD), plasma-enhanced CVD (PECVD), or the like.

Figure 12A:
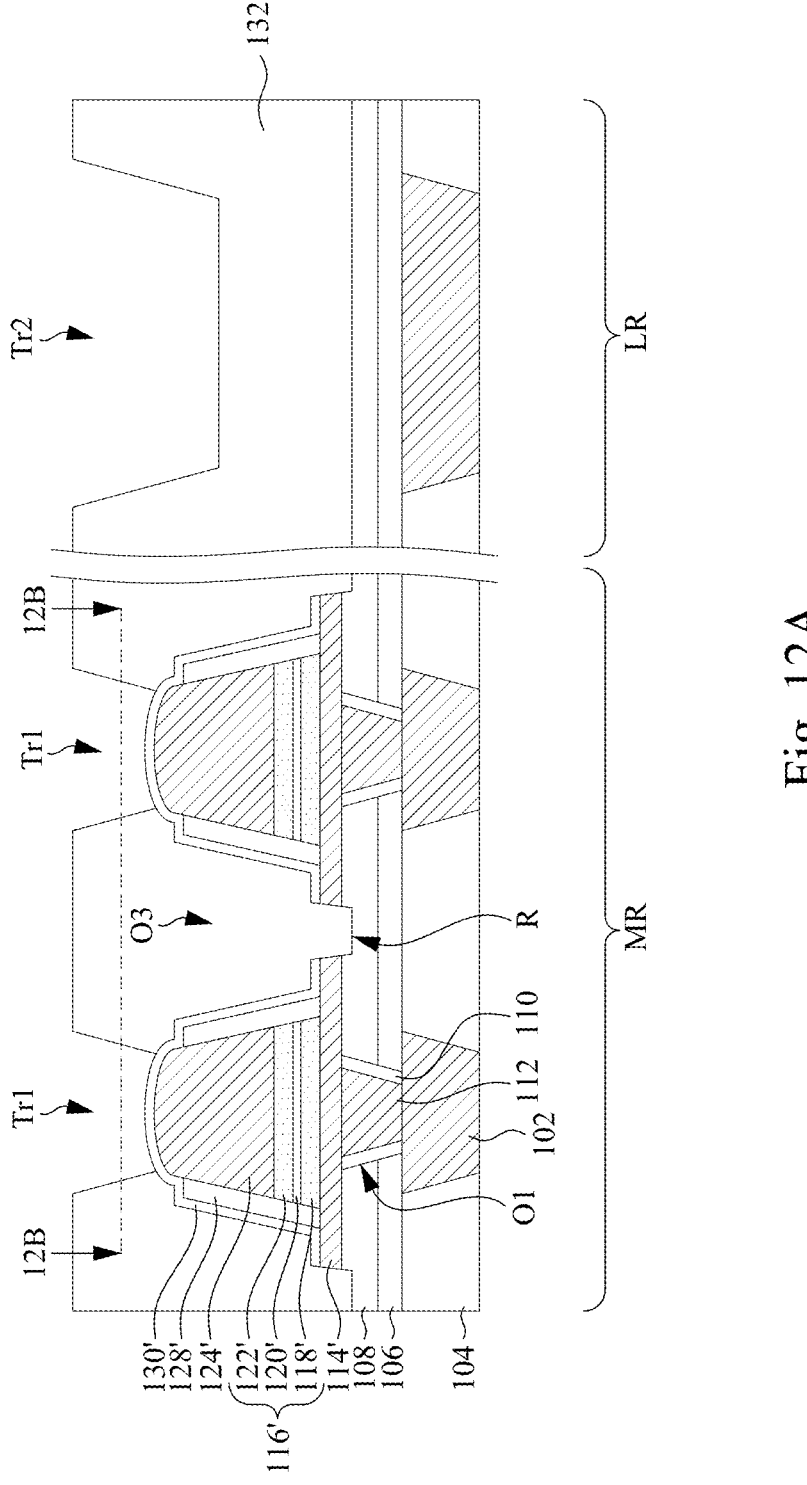
Figure 12B:
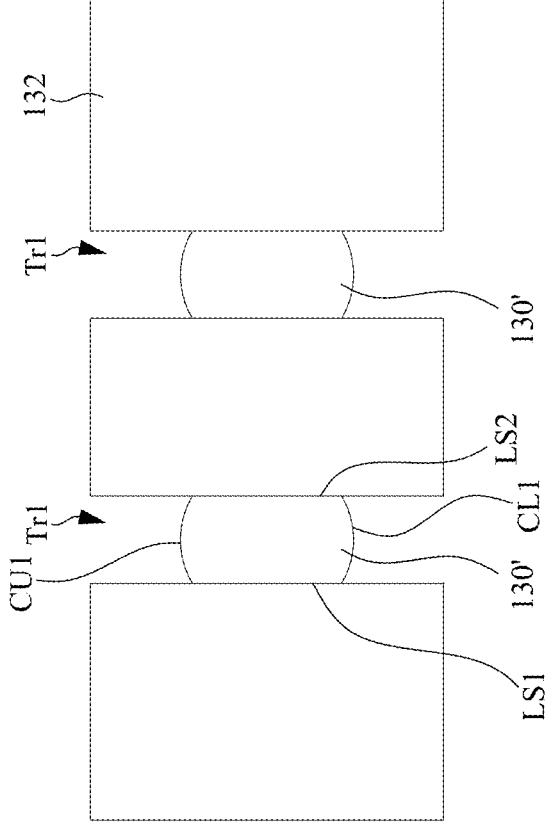
Figure 12B:

Next, a patterning process (e.g., including a photolithography process and an etching process) is performed on the IMD layer 132 to form trenches Tr1 in the IMD layer 132 to expose the etch stop layers 130' within memory region MR, also forming trenches Tr2 in the IMD layer 132 in the logic region LR, as illustrated in FIGS. 12A and 12B. This step can be interchangeably referred to as a trench etching process. FIG. 12A is a cross-sectional view of the integrated circuit structure 100 after the trench etching process is completed, and FIG. 12B is a top view of FIG. 12A's embedded memory region MR as indicated in the cut-away line 12B-12B shown in FIG. 12A, in accordance with some embodiments of the present disclosure.

The trench etching process may include wet etching processes, dry etching processes, or combinations thereof, and may use one or more etchants that etches the IMD layer 132 at a faster etch rate than it etches the etch stop layers 130'. For example, the trench etching process is a dry etching process that may use fluorine-containing gas (e.g., $CF_4$, $SF_6$, $CH_2F_2$, $CHF_3$, $C_4F_8$, and/or $C_2F_6$), other suitable gases and/or plasmas, and/or combinations thereof. The dry etching process may include, for example, RIE, ICP etch, TCP etch, ECR etch, the like, or combinations thereof. The etchant and etch conditions are chosen to selectively etch the IMD layer 132 without substantially etching the etch stop layers 130'. Thus, the etch stop layers 130' serve to relax etch process constraints and improve the etch process window in the trench etching process. Moreover, the convex top surfaces of the top electrodes 124' in the cross-sectional view of FIG. 12A allows for overlying etch stop layers 130' curving or swelling out, which in turn aids in slow down or even stop the trench etching process as well.

As illustrated in the cross-sectional view of FIG. 12A, the trench Tr2 within the logic region LR has a depth deeper than a depth of the trenches Tr1. This is because the logic region LR is free of the etch stop layers 130'. When viewed from above as illustrated in the top view of FIG. 12B, the trenches Tr1 each have a linear shape and respective extend across the circular etch stop layers 130'. In some embodiments, the trenches Tr1 do not expose entireties of the etch stop layers 130'. Instead, portions of the etch stop layers 130' remain covered by the IMD layer 132 after the trench etching process is completed. In that case, when viewed from above the etch stop layer 130' has an upper curve CU1 and a lower curve CL1 extending from a first liner side surface LS1 of the trench T1 to a second liner side surface LS2 of the trench T1.

Figure 13A:
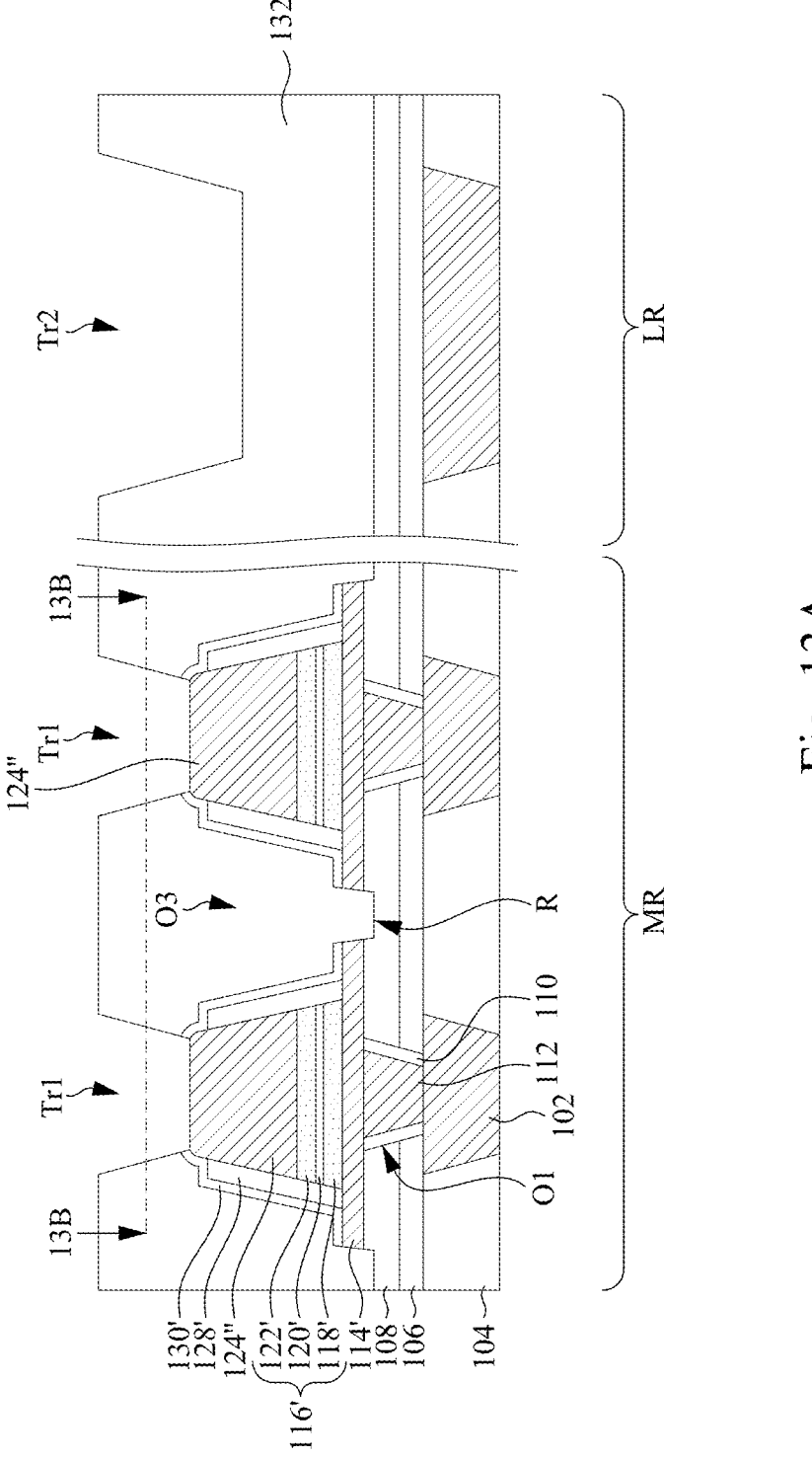
Figure 13B:
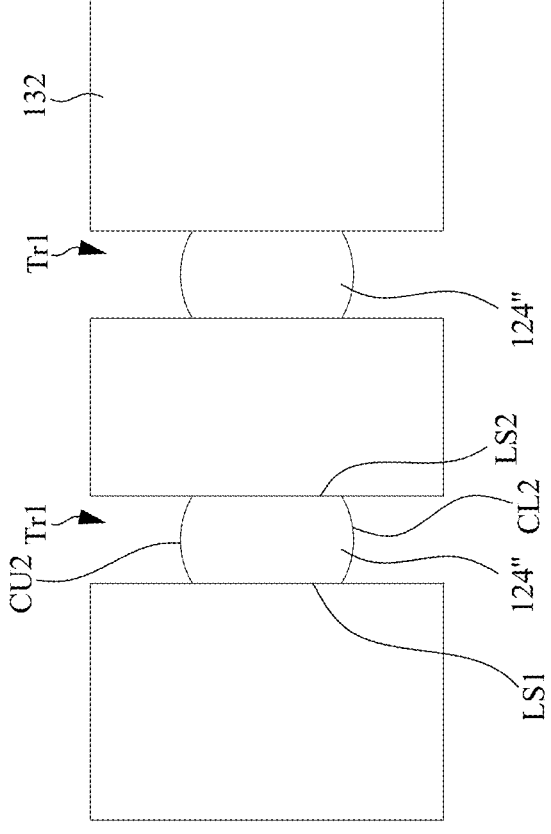
Figure 13B:

After the trench etching process is completed, an etching process is performed to break through the etch stop layers 130' at bottoms of the trenches Tr1, resulting in the top electrodes 124' being exposed at the bottoms of the trenches Tr1, as illustrated in FIGS. 13A and 13B. FIG. 13A is a cross-sectional view of the integrated circuit structure 100 after breaking through the etch stop layers 130', and FIG. 13B is a top view of FIG. 13A's embedded memory region MR as indicated in the cut-away line 13B-13B shown in FIG. 13A, in accordance with some embodiments of the present disclosure.

The etch stop layers 130' can be broken through by using one or more etching processes, which may include wet etching processes, dry etching processes, or combinations thereof, and may use one or more etchants that etches the etch stop layer 130' at a faster etch rate than it etches the IMD layer 132 For example, the etch stop layers 130' can be broken through by using a dry etching process that may use chlorine-containing gas (e.g., $Cl_2$, $CHCl_3$, $CCl_4$, and/or $BCl_3$), other suitable gases and/or plasmas, and/or combinations thereof. The dry etching process may include, for example, RIE, ICP etch, TCP etch, ECR etch, the like, or combinations thereof. The etchant and etch conditions are chosen to selectively etch the etch stop layers 130' without substantially etching the IMD layer 132. Thus, the IMD layer 132 remains substantially unchanged during the etching process. In some embodiments, the top electrodes 124" may be slightly etched, thus reshaping top surfaces of the top electrodes 124". For example, the top surfaces of the top electrodes 124" may be flattened by this etching step, and thus the resultant top surfaces of the top electrodes 124" become less curved.

When viewed from above as illustrated in the top view of FIG. 13B, the trenches Tr1 have a linear shape and extend across respective top electrodes 124". In some embodiments, the trenches Tr1 do not expose entireties of the top electrodes 124". Instead, portions of the top electrodes 124" remain covered by the etch stop layers 130' after breaking through the etch stop layers 130'. In that case, when viewed from above the top electrode 124" has an upper curve CU2 and a lower curve CL2 extending from the first liner side surface LS1 of the trench T1 to the second liner side surface LS2 of the trench T1.

Figure 14:
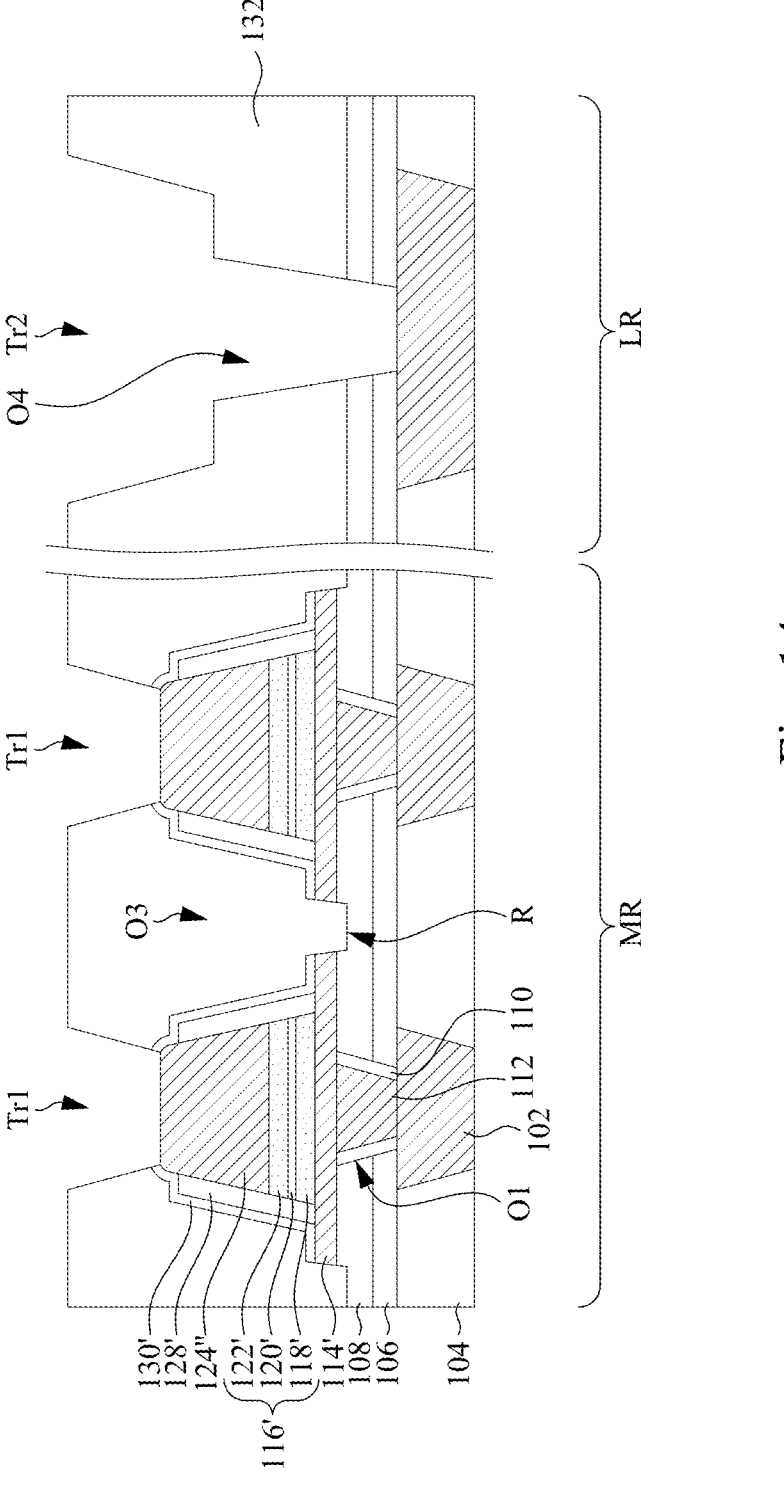

After breaking through the etch stop layers 130' to expose the top electrodes 124", a patterning process (e.g., including a photolithography process and an etching process) is performed on the IMD layer 132 to form a via opening O4 in the IMD layer 132 within the logic region LR, as illustrated in FIG. 14. This step can be interchangeably referred to as a via etching process. Before the via etching process, a photolithograph process may be carried out to form a patterned mask layer (not shown) exposing a partial region of a bottom surface of the trench Tr2. Other structures within the embedded memory region MR and the logic region LR are covered and hence protected by the patterned mask layer during the via etching process. After the via etching process is completed, the patterned mask layer is removed by using, for example, ashing.

The via etching process may include wet etching processes, dry etching processes, or combinations thereof, and may use one or more etchants that etches the IMD layer 132 at a faster etch rate than it etches the patterned mask layer. For example, the via etching process is a dry etching process that may use the same etchant as the trench etching process, such as fluorine-containing gas (e.g., $CF_4$, $SF_6$, $CH_2F_2$, $CHF_3$, $C_4F_8$, and/or $C_2F_6$), other suitable gases and/or plasmas, and/or combinations thereof. The dry etching process may include, for example, RIE, ICP etch, TCP etch, ECR etch, the like, or combinations thereof.

Figure 15A:
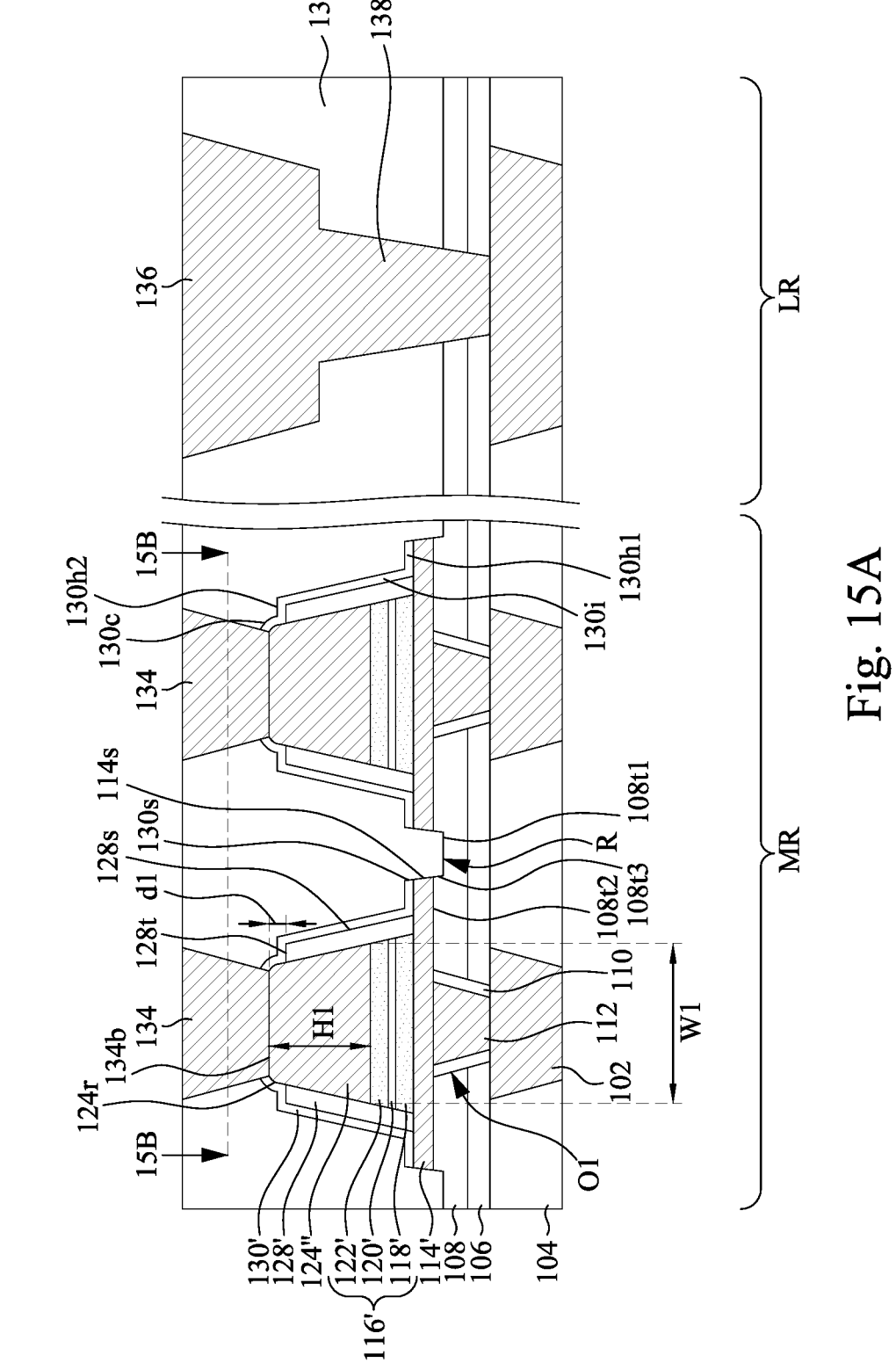
Figure 15B:
Figure 15B:
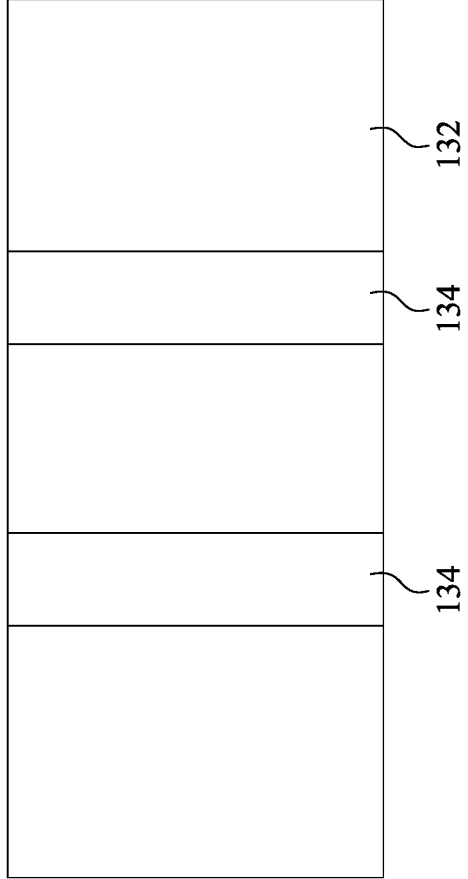

After the via etching process has been completed, one or more conductive materials (e.g., metals) are deposited in the trenches Tr1, Tr2 and the via opening O4, followed by performing a CMP process to remove the excessive metal materials outside the trenches Tr1 and Tr2, while leaving some metal materials in the trenches Tr1, Tr2 to serve as metal lines 134, 136, and leaving some metal materials in the via opening O4 to serve as a metal via 138, as illustrated in FIGS. 15A and 15B. FIG. 15A is a cross-sectional view of the integrated circuit structure 100 after the metal lines and vias are completed, and FIG. 15B is a top view of FIG. 15A's embedded memory region MR as indicated in the cut-away line 15B-15B shown in FIG. 15A, in accordance with some embodiments of the present disclosure.

In some embodiments, the metal lines 134, 136 and the metal via 138 may comprise metals such as copper, aluminum, tungsten, combinations thereof, or the like. In some embodiments, the metal lines 134, 136 and the metal via 138 may further comprise one or more barrier/adhesion layers (not shown) to protect the respective IMD layer 132 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

As illustrated in FIG. 15A, in some embodiments, the top electrodes 124" each have a height H1 in a range from about 40 nm to about 50 nm. If the height H1 is less than about 40 nm, the landing window for forming the metal lines 134 may be tightened, so that the trench etching process (as illustrated in FIGS. 12A and 12B) and the etch stop layer breaking through process (as illustrated in FIGS. 13A and 13B) may damage the MTJ stacks 116'. If the height H1 is greater than about 50 nm, the embedded memory region MR and the logic region LR may have an increased height difference (e.g., height gap), which in turn may lead to an increased challenge on the trench etching process due to an aggravated trench height difference. In some embodiments, the top electrodes 124" each have a width W1 in a range from about 40 nm to about 60 nm. If the width W1 of the top electrodes 124" is greater than about 60 nm, the top electrodes 124" may be closed arranged, so that the MTJ patterning process (as illustrated in FIGS. 5A and 5B) may not completely break through the MTJ layer 116 due to shadowing effect caused by the closely arranged top electrodes 124". If the width W1 of the top electrodes is less than about 40 nm, the landing window for forming the metal lines 134 may be tightened, so that the trench etching process (as illustrated in FIGS. 12A and 12B) and the etch stop layer breaking through process (as illustrated in FIGS. 13A and 13B) may damage the MTJ stacks 116'.

In each MRAM cell, as illustrated in FIG. 15A, the sidewall spacer 128' laterally surrounds the MTJ stack 116' and the top electrode 124'', and the sidewall spacer 128' has an outermost sidewall laterally set back from an outermost sidewall 114s of the bottom electrode 114'. Moreover, the dielectric layer 108 has a stepped top surface having an upper step 108t2 contacting a bottom surface of the bottom electrode 114', a lower step 108t1 around the upper step 108t2, and a step rise 108t3 connecting the lower step 108t1 and the upper step 108t2. The outermost sidewall 128s of the sidewall spacer 128' is also laterally set back from the step rise 108t3 of the dielectric layer 108, but the outermost sidewall 114s of the bottom electrode 114' is aligned with the step rise 108t3 of the dielectric layer 108. Moreover, the etch stop layer 130' has a outermost edge 130s aligned with the outermost sidewall 114s of the bottom electrode 114' (i.e., the edge of the bottom electrode 114') as well as the step rise 108t3 of the dielectric layer 108. Moreover, the etch stop layer 130' has a lower horizontal portion 130h1 extending along a top surface of the bottom electrode 114', an inclined portion 130i extending at an obtuse angle from the lower horizontal portion 130h1 along the outermost sidewall 128s of the sidewall spacer 128', an upper horizontal portion 130h2 capping a top end 128t of the sidewall spacer 128', and a curved portion 130c in contact with a round corner 124r of the top electrode 124''. The curved portion 130c is in contact with a sidewall of the metal line 134. The metal line 134 has a bottom surface 134b higher than the top end 128t of the sidewall spacer 128' by a non-zero distance d1.

Figure 16:
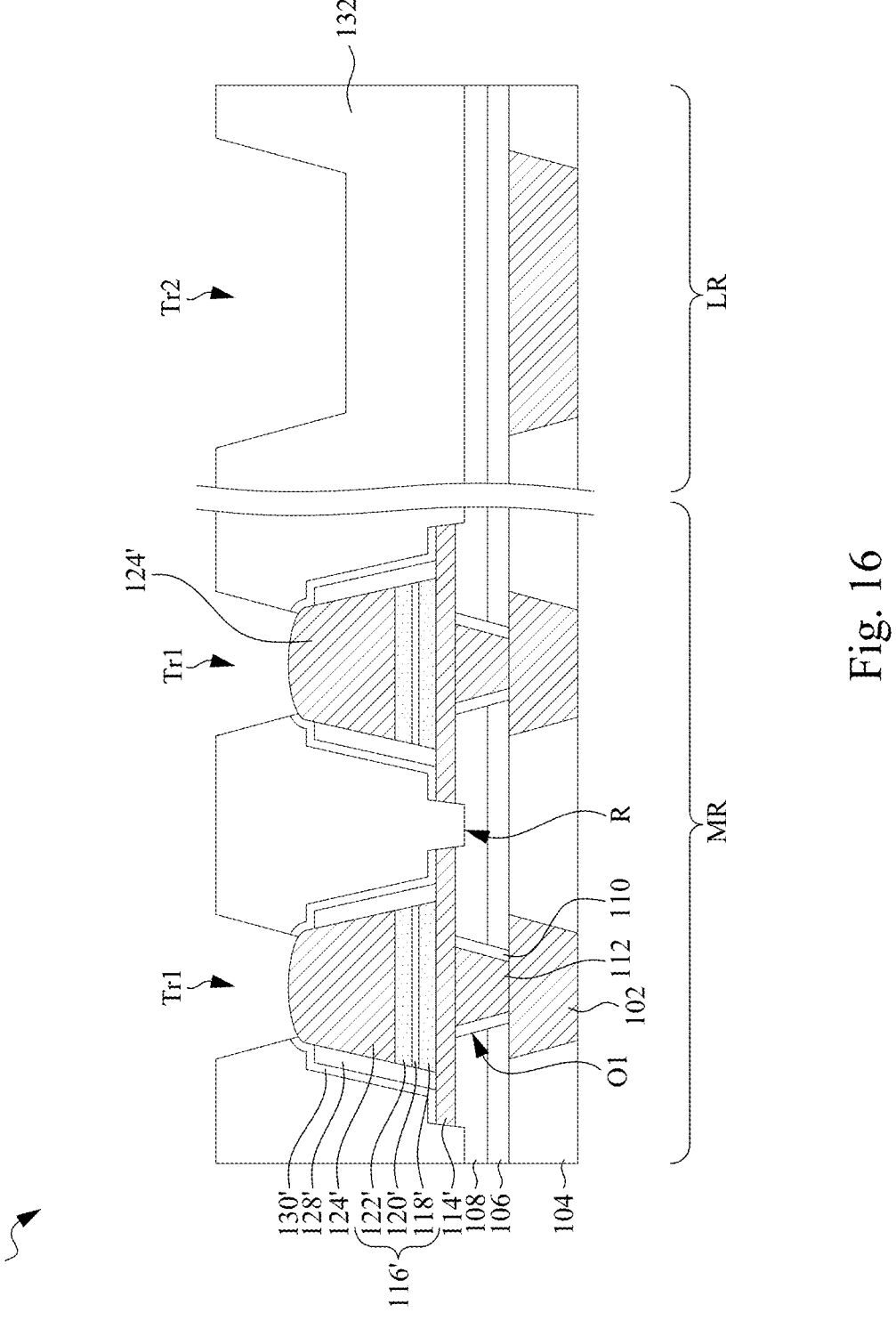
FIGS. 16-18 illustrate cross-sectional views of intermediate stages in formation of an integrated circuit structure having an embedded memory region and a logic region, in accordance with some embodiments of the present disclosure.
Figure 17:
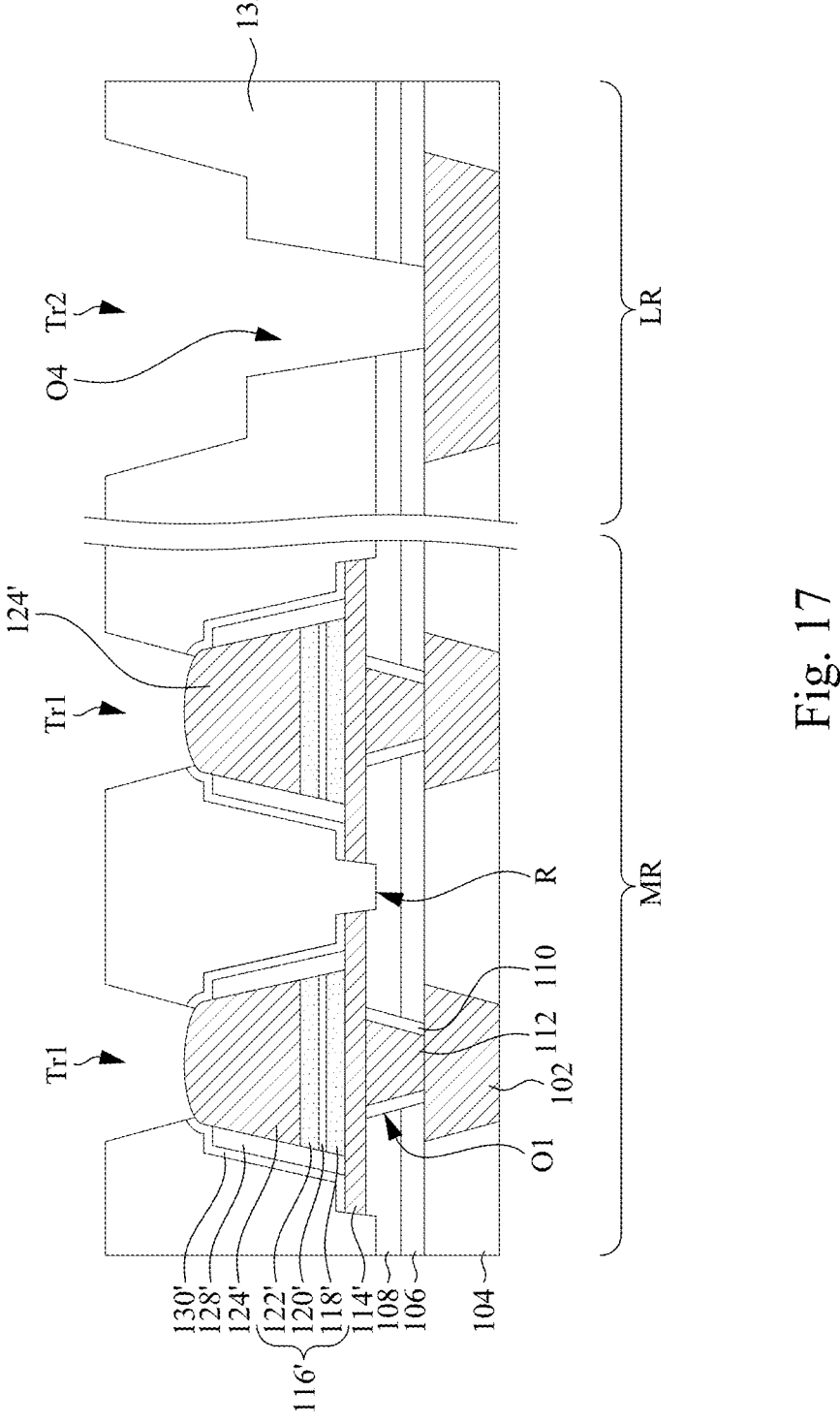
Figure 18:
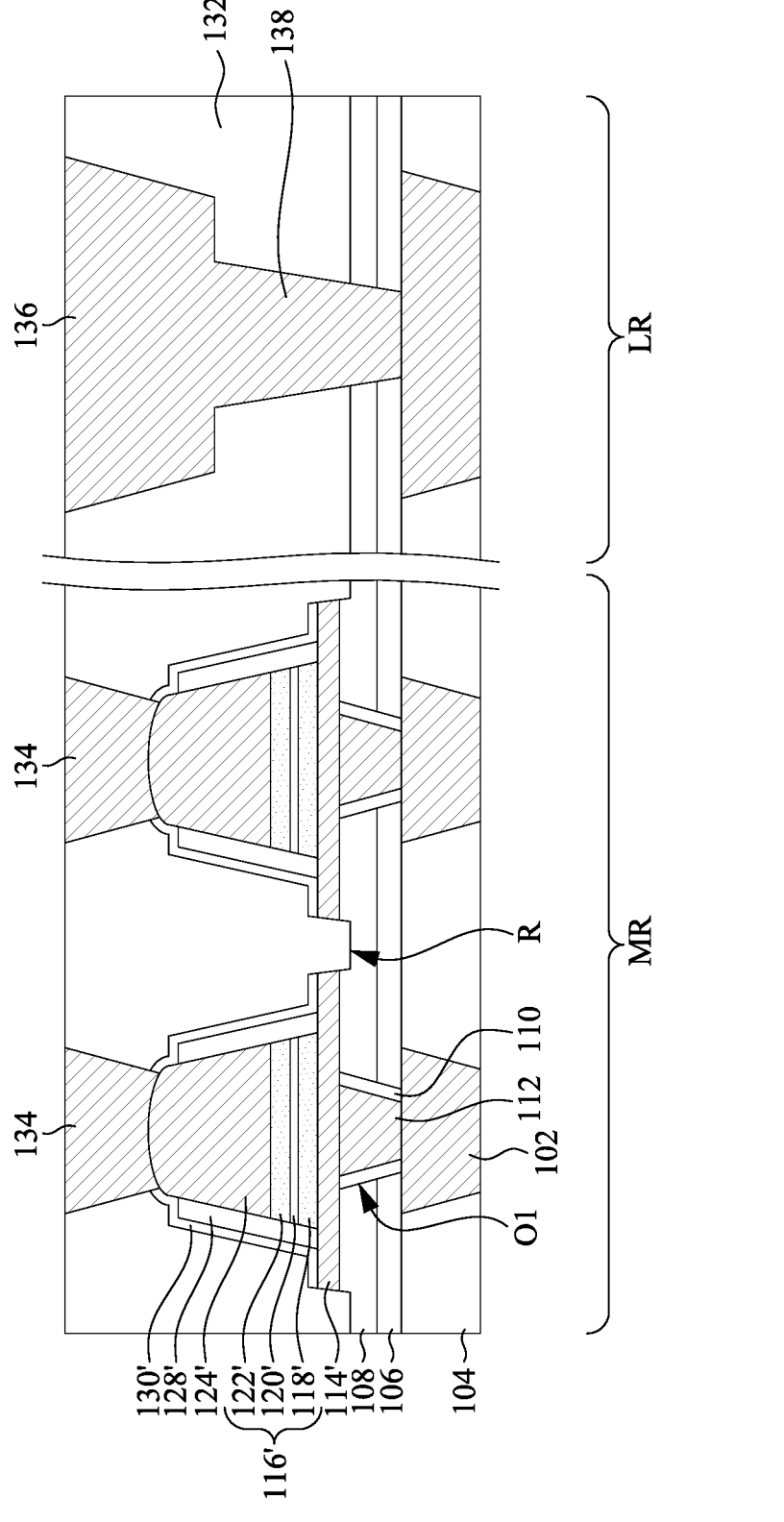

FIGS. 16-18 illustrate cross-sectional views of intermediate stages in formation of an integrated circuit structure 100a having an embedded memory region MR and a logic region LR, in accordance with some embodiments of the present disclosure. Although the cross-sectional views shown in FIGS. 16-18 are described with reference to a method, it will be appreciated that the structures shown in FIGS. 16-18 are not limited to the method but rather may stand alone separate of the method. Although FIGS. 16-18 are described as a series of acts, it will be appreciated that these acts are not limiting in that the order of the acts can be altered in other embodiments, and the methods disclosed are also applicable to other structures.

FIG. 16 illustrates some embodiments of breaking through the etch stop layers 130' that is subsequent to the step of trench etching process as illustrated in FIGS. 12A and 12B. FIG. 16 shows substantially the same result as FIG. 13A, except that the top surfaces of the top electrodes 124' still remain convex after breaking through the etch stop layers 130'. This can be achieved by a selective etching process that etches the etch stop layers 130' at a faster etch rate than it etching the top electrodes 124'. In this way, the top electrodes 124' can remain substantially intact during the selective etching process. The convex top electrode profile allows for increased contact area between the top electrodes 124' and subsequently formed metal lines, which in turn reduces contact resistance.

After performing the selective etching process to breaking through the etch stop layers 130', a via etching process is performed to form a via opening O4 in the in the IMD layer 132 within the logic region LR, as illustrated in FIG. 17. Details about formation of the via opening O4 are discussed previously with respect FIG. 14, and thus they are not repeated herein for the sake of brevity.

Afterwards, metal lines 134, 136 are formed in the trenches Tr1, Tr2, and a metal via 138 is formed in the via opening O4 by using suitable deposition techniques followed by a CMP process. Details about the metal lines 134, 136 and the metal via 138 are discussed previously with respect FIG. 15, and thus they are not repeated herein for the sake of brevity. Because of the convex top electrode profile, the metal lines 134 form curved interfaces with the respective top electrodes 124', which allows for an increased contact area between the metal line 134 and top electrodes 124' and hence reduced contact resistance.

Figure 19:
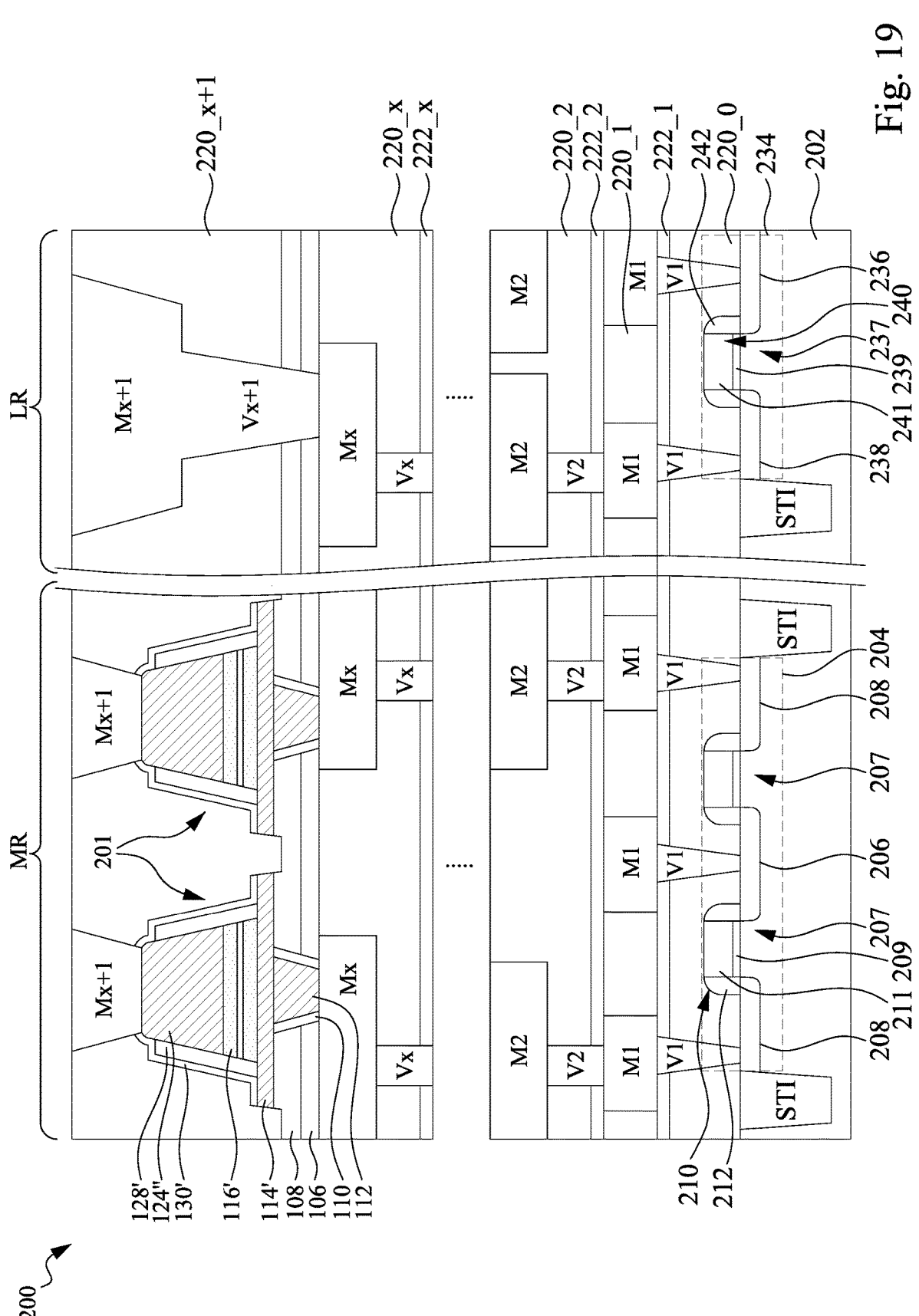
FIG. 19 illustrates an integrated circuit structure including MRAM cells in the embedded memory region and logic devices in the logic region, in accordance with some embodiments of the present disclosure.

FIG. 19 illustrates an integrated circuit structure 200 including MRAM cells 201 in the embedded memory region MR and logic devices in the logic region LR, in accordance with some embodiments of the present disclosure. Embedded memory region MR may include one or more selection transistors 204 electrically connected to the MRAM cells 201. Logic region LR may include circuitry, such as the exemplary transistors 234, for processing information received from MRAM cells 201 in the embedded memory region MR.

The integrated circuit structure 200 comprises a semiconductor body 202. The semiconductor body 202 may be, for example, a bulk semiconductor substrate, such as a bulk silicon substrate, or a silicon-on-insulator (SOI) substrate. One or more selection transistors 204 are arranged within the semiconductor body 202 in the embedded memory region MR, and one or more logic transistors 234 are arranged with in the semiconductor body 202 in the logic region LR. In some embodiments, the one or more selection transistors 204 are disposed between shallow trench isolation (STI) regions, and the one or more logic transistors 234 are disposed between STI regions as well.

In some embodiments, the one or more selection transistors 204 may comprise MOSFET (metal-oxide-silicon field effect transistor) devices. In such embodiments, the one or more selection transistors 204 respectively comprise a source region 206 and a drain region 208, separated by a channel region 207. The source region 206 comprises a first doping type (e.g., an n-type dopant), the channel region 207 comprises a second doping type (e.g., a p-type dopant) different than the first doping type, and the drain region 208 comprises the first doping type. In some embodiments, the first doping type comprises an n-type doping, while in other embodiments the first doping type comprises a p-type doping. A gate structure 210, comprising a gate electrode 211 separated from the channel region 207 by a gate oxide layer 209 as an example, is configured to control the flow of charge carriers between the source region 206 and the drain region 208. In some embodiments, the gate structure 210 may comprise a doped polysilicon material or a metal material (e.g., tungsten, titanium nitride, aluminum, etc.). In some embodiments, gate sidewalls spacers 212 (e.g., SiN spacers) may be disposed on opposing sides of the gate electrode 211.

Similarly, the one or more logic transistors 234 may comprise MOSFET (metal-oxide-silicon field effect transistor) devices. In such embodiments, the one or more logic transistors 234 respectively comprise a source region 236 and a drain region 238, separated by a channel region 237. A gate structure 240, comprising a gate electrode 241 separated from the channel region 237 by a gate oxide layer 239 as an example, is configured to control the flow of charge carriers between the source region 236 and the drain region 238. In some embodiments, the gate structure 240 may comprise a doped polysilicon material or a metal material (e.g., tungsten, titanium nitride, aluminum, etc.). In some embodiments, gate sidewalls spacers 242 (e.g., SiN spacers) may be disposed on opposing sides of the gate electrode 241.

A back-end-of-the-line (BEOL) metal stack is disposed over the semiconductor body 202. The BEOL metal stack comprises a metal contact V1 configured to connect the source region 206 to a metal line M1 that acts as a source line. The BEOL metal stack further comprises a plurality of metal interconnects (e.g., horizontal interconnects and vertical interconnects) configured to connect the drain regions 208 to one or more MRAM cells 201. In some embodiments, the plurality of metal interconnects may comprise one or more metal contacts V1 vertically extending within an interlayer dielectric (ILD) layer 220_0, and configured to electrically couple the drain region 208 to a metal line M1 horizontally or laterally extending within an IMD layer 220_1. The plurality of metal interconnects may further comprise a metal via V2 vertically extending within another IMD layer 220_2, and configured to electrically couple the metal line M1 to a metal line M2 horizontally or laterally extending within the IMD layer 220_2. One or more interconnect layers (including stacked IMD layers and metal lines and vias extending in the IMD layers) may be disposed over the IMD layer 220_2. A metal via Vx vertically extends within another IMD layer 220_x, and configured to electrically couple the one or more interconnect layers to a metal line Mx horizontally or laterally extending within the IMD layer 220_x.

The one or more MRAM cells 201 are disposed within another IMD layer 220_x+1 disposed over the IMD layer 220_x. One or more metal lines Mx+1 extend horizontally or laterally within the IMD layer 220_x+1 and electrically coupled to the one or more MRAM cells 201. A metal via Vx+1 vertically extends within the IMD layer 220_x+1 and is configured to electrically connect the metal line Mx to the metal line Mx+1. The one or more metal lines Mx+1 may act as bit lines to control the respective MRAM cells 201. In some embodiments, the ILD layer 220_0 and IMD layers 220_1 to 220_x are separated by etch stop layers 222_1 to 222_x. In some embodiments, the ILD layer 220_0 and IMD layers 220_1 to 220_x are formed of oxide, and the etch stop layers 222_1 to 222_x are formed of silicon nitride.

FIG. 20 is a flow chart illustrating a method of forming an integrated circuit structure in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a bottom electrode layer, an MTJ layer and a top electrode layer are formed over BEVAs. FIGS. 3A and 3B illustrate a cross-sectional view and a top view according to some embodiments of block S101.

At block S102, a first patterned mask layer is formed over the top electrode layer. FIGS. 3A and 3B also illustrate a cross-sectional view and a top view according to some embodiments of block S102.

At block S103, the top electrode layer is patterned into top electrodes using the first patterned mask layer as an etch mask. FIGS. 4A and 4B illustrate a cross-sectional view and a top view according to some embodiments of block S103.

At block S104, the MTJ layer is patterned into MTJ stacks using the top electrodes as an etch mask. FIGS. 5A and 5B illustrate a cross-sectional view and a top view according to some embodiments of block S104.

At block S105, a spacer layer is disposed over the top electrodes and the MTJ stacks. FIG. 6 illustrates a cross-sectional view according to some embodiments of block S105.

At block S106, an SPA etching process is performed on the spacer layer to form sidewall spacers self-aligned to sidewalls of the top electrodes and the MTJ stacks. FIGS. 7A and 7B illustrate a cross-sectional view and a top view according to some embodiments of block S106.

At block S107, the SPA etching is stopped before the bottom electrode layer is patterned. FIGS. 7A and 7B also illustrate a cross-sectional view and a top view according to some embodiments of block S107.

At block S108, an etch stop layer is formed over the top electrodes. FIG. 8 illustrates a cross-sectional view according to some embodiments of block S108.

At block S109, a second patterned mask layer is formed over the top electrodes. FIGS. 9A and 9B illustrate a cross-sectional view and a top view according to some embodiments of block S109.

At block S110, the bottom electrode layer is patterned into bottom electrodes using the second patterned mask layer as an etch mask. FIGS. 10A and 10B illustrate a cross-sectional view and a top view according to some embodiments of block S110.

Figure 11:
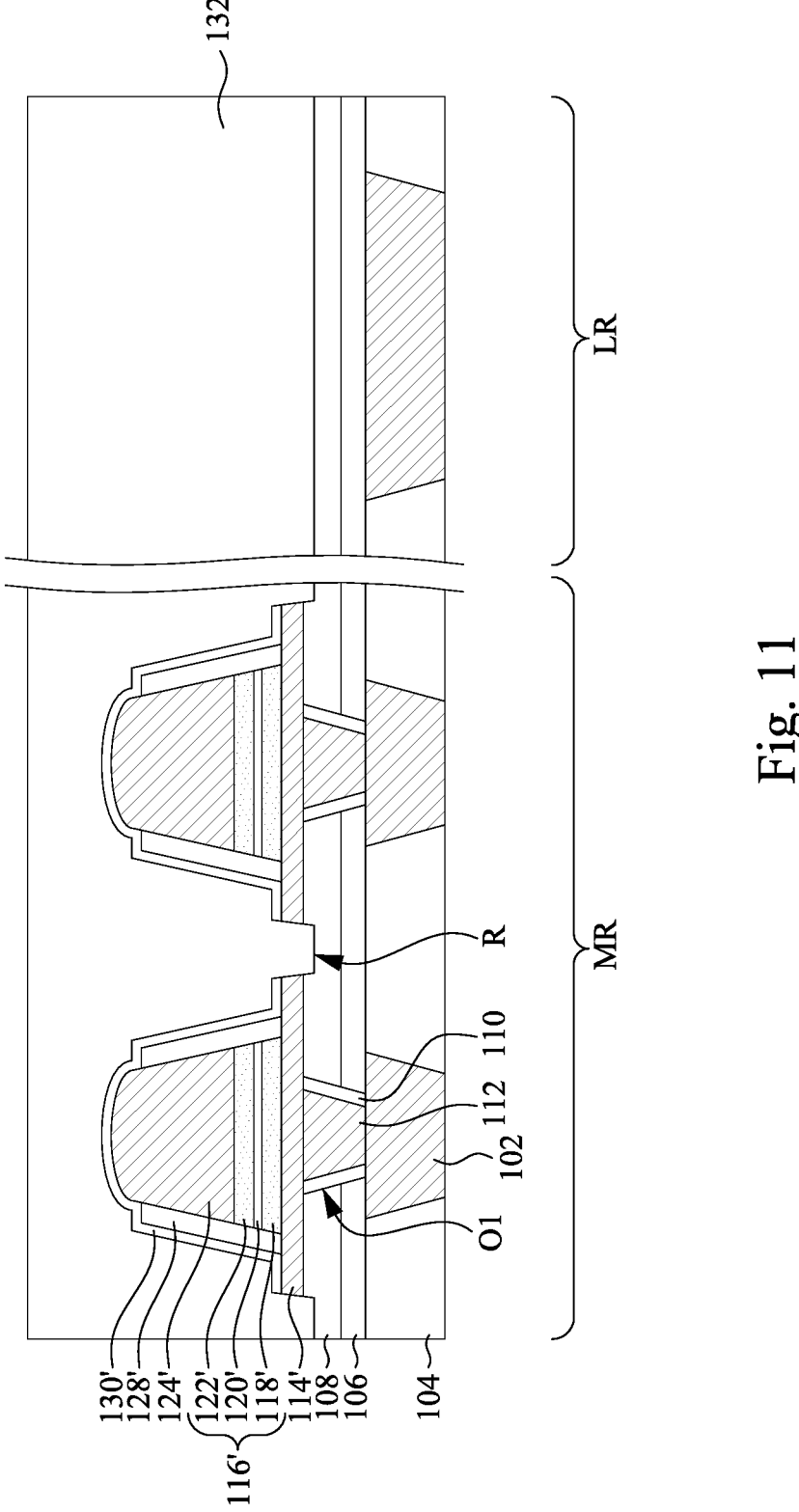

At block S111, an IMD layer is formed over the etch stop layer. FIG. 11 illustrates a cross-sectional view according to some embodiments of block S111.

At block S112, trenches are etched in the IMD layer until the etch stop layer is exposed. FIGS. 12A and 12B illustrate a cross-sectional view and a top view according to some embodiments of block S112.

At block S113, the etch stop layer is etched until the top electrodes are exposed. FIGS. 13A and 13B illustrate a cross-sectional view and a top view according to some embodiments of block S113. FIG. 16 illustrates a cross-sectional view according to some other embodiments of block S113.

At block S114, metal lines are formed in the trenches. FIGS. 15A and 15B illustrate a cross-sectional view and a top view according to some embodiments of block S114. FIG. 18 illustrates a cross-sectional view according to some other embodiments of block S114.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the top electrode is not etched and consumed by the bottom electrode patterning process, which in turn alleviates or prevents height reduction in the top electrode, thus allowing for a more relaxed landing window for the trench etching process.

In some embodiments, a memory device includes a bottom electrode, a magnetic tunnel junction (MTJ) stack, a top electrode, and a sidewall spacer. The MTJ stack is over the bottom electrode. The top electrode is over the MTJ stack. The sidewall spacer laterally surrounds the MTJ stack and the top electrode. The sidewall spacer has an outermost sidewall laterally set back from an outermost sidewall of the bottom electrode.

In some embodiments, a memory device includes a bottom electrode, a top electrode, an MTJ stack, a sidewall spacer, an etch stop layer, and a metal structure. The top electrode is above the bottom electrode. The MTJ stack is disposed between the bottom electrode and the top electrode. The sidewall spacer laterally surrounds the MTJ stack and the top electrode. The etch stop layer laterally surrounds the sidewall spacer. The etch stop layer has an outermost edge aligned with an edge of the bottom electrode. The metal structure extends through the etch stop layer to the top electrode.

In some embodiments, a method includes forming an MTJ layer and a top electrode layer over a bottom electrode layer; patterning the top electrode layer into top electrodes and patterning the MTJ layer into MTJ stacks respectively below the top electrodes; depositing a spacer layer over the top electrodes; etching the spacer layer to form sidewall spacers that laterally surround the MTJ stacks, respectively; forming a patterned mask layer over the top electrodes; and with the patterned mask layer in place, performing a first etching process to pattern the bottom electrode layer into bottom electrodes respectively below the MTJ stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a bottom electrode layer over a dielectric layer;
forming a magnetic tunnel junction (MTJ) layer and a top electrode layer over the bottom electrode layer;
patterning the top electrode layer into top electrodes;
patterning the MTJ layer into MTJ stacks below the top electrodes, respectively;
depositing a spacer layer over the top electrodes and the MTJ stacks;
etching the spacer layer to form sidewall spacers that laterally surround the MTJ stacks, respectively;
depositing an etch stop layer over the top electrodes;
forming a patterned mask layer over the top electrodes;
performing a first etching process to pattern the bottom electrode layer into bottom electrodes below the MTJ stacks, wherein the first etching process patterns the etch stop layer into patterned etch stop layers over the bottom electrodes, and removes the etch stop layer from the logic region, and top ends of the sidewall spacers are fully and directly capped by respective horizontal portions of the patterned etch stop layers, and wherein performing the first etching process includes forming recessed regions extending through the dielectric layer, the etch stop layer, and the MTJ layer;
after performing the first etching process, exposing upper and side surfaces of the patterned etch stop layers by removing the patterned mask layer;
depositing an inter-metal dielectric (IMD) layer directly onto the upper and side surfaces of the patterned etch stop layers and directly onto the dielectric layer exposed by openings between the bottom electrodes;
performing a second etching process to form trenches in the IMD layer until the patterned etch stop layers are exposed;
performing a third etching process to break through the exposed patterned etch stop layers until the top electrodes are exposed, wherein performing the third etching process forms curved portions of the etch stop layer that extend from the horizontal portions, and performing the third etching process extends the trenches to respective surfaces of the top electrodes exposing the respective surfaces of the top electrodes, and the trenches being delimited by the curved portions of the etch stop layer and the IMD layer; and after performing the third etching process, performing a deposition process that forms metal lines in the trenches, wherein performing the deposition process that forms the metal lines in the trenches forms the metal lines directly on and in physical contact with the IMD layer and the curved portions of the etch stop layer.

2. The method of claim 1, wherein etching the spacer layer stops when the bottom electrode layer is not broken.

3. The method of claim 1, wherein etching the spacer layer stops when the top electrodes are substantially intact.

4. The method of claim 1, wherein patterning the MTJ layer results in the top electrodes having round top surfaces, and the round top surfaces of the top electrodes remain substantially intact after etching the spacer layer.

5. A method, comprising:
forming a bottom electrode layer on a dielectric layer;
forming a magnetic tunnel junction (MTJ) layer over the bottom electrode layer;
forming a top electrode layer over the MTJ layer;
patterning the top electrode layer into top electrodes, each respective top electrode of the top electrodes including a curved top surface;
patterning the MTJ layer into MTJ stacks below the top electrodes, respectively;
depositing a spacer layer over the top electrodes and the MTJ stacks;
etching the spacer layer to form sidewall spacers that laterally surround the MTJ stacks, respectively;
after etching the spacer layer, forming an etch stop layer on the top electrodes, the sidewall spacers and the bottom electrode layer;
after forming the etch stop layer, forming a patterned mask layer over the top electrodes;
with the patterned mask layer in place, performing a first etching process to pattern the bottom electrode layer into bottom electrodes below the MTJ stacks, respectively, wherein the first etching process patterns the etch stop layer into patterned etch stop layers over the bottom electrodes, respectively, and the topmost surface of the sidewall spacers are lower than the topmost surface of the top electrode, and top ends of the sidewall spacers is fully and directly capped by respective horizontal portions of the patterned etch stop layers, and wherein performing the first etching process includes forming recessed regions extending through the dielectric layer, the etch stop layer, and the MTJ layer;
after performing the first etching process, exposing upper and side surfaces of the patterned etch stop layers by removing the patterned mask layer;
after removing the patterned mask layer, depositing an inter-metal dielectric (IMD) layer directly on the upper and side surfaces of the patterned etch stop layers and exposed portions of the dielectric layer;
performing a second etching process to form trenches in the IMD layer until the patterned etch stop layers are exposed;

performing a third etching process to break through the exposed patterned etch stop layers until the curved top surfaces of the top electrodes are exposed, wherein performing the third etching process forms curved portions of the etch stop layer that extend from the horizontal portions, and performing the third etching process extends the trenches to the curved top surfaces of the top electrodes exposing the curved top surfaces of the top electrodes, and the trenches being delimited by the curved portions of the etch stop layer and the IMD layer; and after performing the third etching process, performing a deposition process that forms metal lines in the trenches, wherein performing the deposition process that forms the metal lines in the trenches forms the metal lines directly on and in physical contact with the IMD layer, the curved portions of the etch stop layer, and the curved top surfaces of the top electrodes.

6. The method of claim 5, wherein etching the spacer layer stops when the bottom electrode layer is not broken.

7. The method of claim 5, wherein etching the spacer layer stops when the top electrodes are substantially intact.

8. The method of claim 5, wherein patterning the MTJ layer results in the top electrodes having round top surfaces, and the round top surfaces of the top electrodes remain substantially intact after etching the spacer layer.

9. The method of claim 5, wherein the performing a first etching process to pattern the bottom electrode layer into bottom electrodes results in the sidewall spacers having respective outermost sidewalls that are laterally set back from respective outermost sidewalls of the bottom electrodes.

10. The method of claim 5, wherein etching the spacer layer to form sidewall spacers and performing a first etching process to pattern the bottom electrode layer into bottom electrodes results in, from a top view, the sidewall spacer forming a ring-shaped pattern and the bottom electrode forming a substantially circular pattern having a diameter greater than an outside diameter of the ring-shaped pattern formed from the sidewall spacer.

11. The method of claim 5, wherein the forming an etch stop layer forms the etch stop layer as an aluminum-containing dielectric.

12. The method of claim 5, wherein the performing a first etching process results in the dielectric layer below the bottom electrode having a stepped top surface having an upper step contacting a bottom surface of the bottom electrode, a lower step around the upper step, and a step rise connecting the lower step and the upper step.

13. The method of claim 12, wherein the performing a first etching process results in an outermost sidewall of the bottom electrode being aligned with the step rise of the dielectric layer.

14. A method, comprising:

in a memory region and a logic region, forming a magnetic tunnel junction (MTJ) layer and a top electrode layer over a bottom electrode layer over a dielectric layer;

patterning the top electrode layer in the memory region into top electrodes, each respective top electrode of the top electrodes includes a flat top surface;

patterning the MTJ layer in the memory region into MTJ stacks below the top electrodes, respectively;

in the memory region and the logic region, depositing a spacer layer over the top electrodes and the MTJ stacks;

etching the spacer layer to form sidewall spacers in the memory region that laterally surround the MTJ stacks, respectively;

after etching the spacer layer, forming an etch stop layer on the top electrodes, the sidewall spacers and the bottom electrode layer;

after forming the etch stop layer, forming a patterned mask layer in the memory region over the top electrodes;

with the patterned mask layer in place, performing a first etching process to pattern the bottom electrode layer into bottom electrodes below the MTJ stacks, respectively, and to pattern the etch stop layer into patterned etch stop layers, wherein the first etching process removes the etch stop layer from over the logic region, and the etch stop layers are in contact with the top electrode after patterning, and top ends of the sidewall spacers is fully and directly capped by respective horizontal portions of the patterned etch stop layers, and wherein performing the first etching process includes forming recessed regions extending through the dielectric layer, the etch stop layer, and the MTJ layer;

after performing the first etching process, exposing upper and side surfaces of the patterned etch stop layers by removing the patterned mask layer;

after removing the patterned mask layer, depositing an inter-metal dielectric (IMD) layer in the memory region and the logic region directly on the upper and side surfaces of the patterned etch stop layers and directly on the dielectric layer exposed by openings between the bottom electrodes, the IMD layer covering the patterned etch stop layers;

performing a second etching process to form first trenches in the IMD layer in the memory region until the patterned etch stop layers are exposed, wherein the second etching process forms a second trench with a bottom surface in the logic region, the bottom surface of the second trench being lower than a top surface of the top electrodes;

performing a third etching process to break through the exposed patterned etch stop layers until the flat top surfaces of the top electrodes are exposed, wherein performing the third etching process forms curved portions of the etch stop layer that extend from the horizontal portions, and performing the third etching process extends the trenches to the flat top surfaces of the top electrodes exposing the flat top surfaces of the top electrodes, and the trenches being delimited by the curved portions of the etch stop layer and the IMD layer;

performing a fourth etching process to form a via opening in the second trench that exposes a metal line in the logic region, an upper surface of the metal line being below the bottom electrode; and after performing the third and fourth etching processes, performing a deposition process that forms metal lines in the first trenches and the second trench and a metal via in the via opening, wherein performing the deposition process that forms the metal lines in the trenches forms the metal lines directly on and in physical contact with the IMD layer, the curved portions of the etch stop layer, and the flat top surfaces of the top electrodes.

15. The method of claim 14, wherein etching the spacer layer stops when the bottom electrode layer is not broken.

16. The method of claim 14, wherein etching the spacer layer stops when the top electrodes are substantially intact.

17. The method of claim 14, wherein patterning the MTJ layer results in the top electrodes having round top surfaces, and the round top surfaces of the top electrodes remain substantially intact after etching the spacer layer.

18. The method of claim 14, wherein the performing a first etching process to pattern the bottom electrode layer into bottom electrodes results in the sidewall spacers having respective outermost sidewalls that are laterally set back from respective outermost sidewalls of the bottom electrodes.

19. The method of claim 14, wherein etching the spacer layer to form sidewall spacers and performing a first etching process to pattern the bottom electrode layer into bottom electrodes results in, from a top view, the sidewall spacer forming a ring-shaped pattern and the bottom electrode forming a substantially circular pattern having a diameter greater than an outside diameter of the ring-shaped pattern formed from the sidewall spacer.

20. The method of claim 14, wherein the performing a first etching process results in the dielectric layer below the bottom electrode having a stepped top surface.

\* \* \* \* \*